(12) United States Patent
Saito

(10) Patent No.: US 10,727,169 B2
(45) Date of Patent: Jul. 28, 2020

(54) SEMICONDUCTOR DEVICE HAVING LEAD WITH BACK AND END SURFACES PROVIDED WITH PLATING LAYERS

(71) Applicant: Rohm Co., Ltd., Kyoto-shi, Kyoto (JP)

(72) Inventor: Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/364,517

(22) Filed: Mar. 26, 2019

(65) Prior Publication Data

US 2019/0304879 A1 Oct. 3, 2019

(30) Foreign Application Priority Data

Mar. 29, 2018 (JP) .................................. 2018-063641

(51) Int. Cl.
| | | |
|---|---|---|
| *H01L 23/49* | (2006.01) | |
| *H01L 23/495* | (2006.01) | |
| *H01L 23/31* | (2006.01) | |
| *H01L 21/56* | (2006.01) | |
| *H01L 21/683* | (2006.01) | |
| *H01L 23/00* | (2006.01) | |
| *C23F 17/00* | (2006.01) | |
| *C25D 7/12* | (2006.01) | |
| *H01L 21/48* | (2006.01) | |

(52) U.S. Cl.
CPC .......... *H01L 23/4951* (2013.01); *C23F 17/00* (2013.01); *C25D 7/12* (2013.01); *H01L 21/4842* (2013.01); *H01L 21/561* (2013.01); *H01L 21/6836* (2013.01); *H01L 23/3107* (2013.01); *H01L 23/4952* (2013.01); *H01L 23/49562* (2013.01); *H01L 23/49582* (2013.01); *H01L 24/48* (2013.01); *H01L 2224/48247* (2013.01)

(58) Field of Classification Search
CPC ............. H01L 23/4951; H01L 23/3107; H01L 23/49582; H01L 21/6836; H01L 24/48
See application file for complete search history.

(56) References Cited

FOREIGN PATENT DOCUMENTS

JP 2016-18846 A 2/2016

*Primary Examiner* — William Coleman
(74) *Attorney, Agent, or Firm* — Hamre, Schumann, Mueller & Larson, P.C.

(57) ABSTRACT

A semiconductor device includes a semiconductor element, a plurality of leads electrically connected to the semiconductor element and one of which supports the semiconductor element, a sealing resin covering the semiconductor element and a portion of each leads, and first and second plating layers exposed from the sealing resin. The sealing resin includes a resin side surface facing in a first direction perpendicular to the thickness direction. At least one of the leads has a lead end surface connected to its back surface and flush with the resin side surface. The first plating layer covers the back surface of the lead. The second plating layer covers the lead end surface and projects in the first direction relative to the resin side surface. An edge of the second plating layer overlaps with the first plating layer as viewed in the first direction.

18 Claims, 22 Drawing Sheets

FIG.21
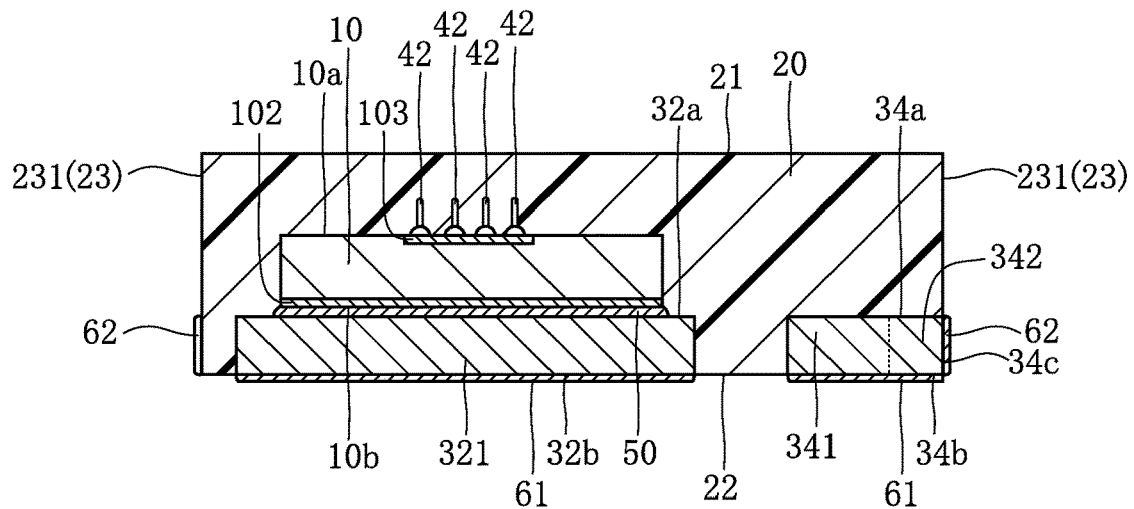
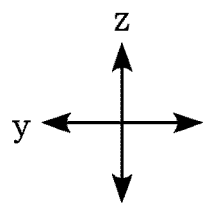
FIG.22
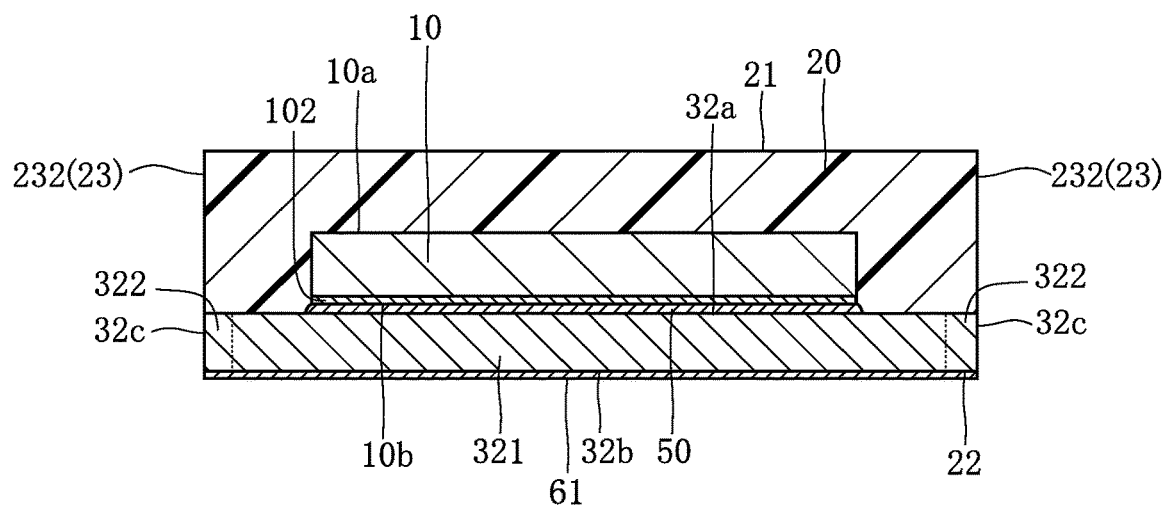
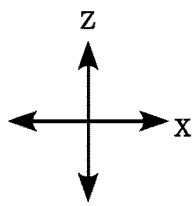

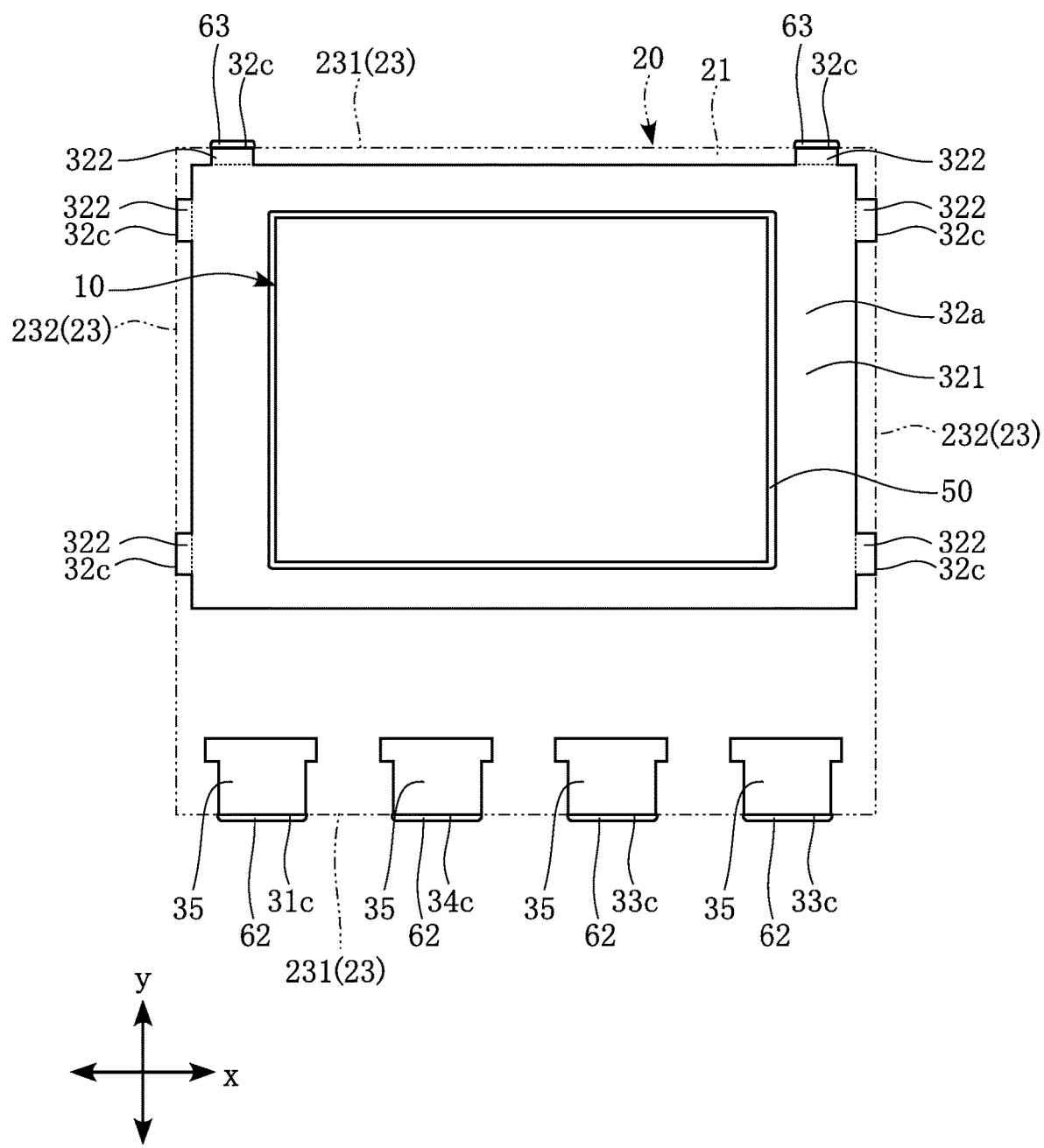

SEMICONDUCTOR DEVICE HAVING LEAD WITH BACK AND END SURFACES PROVIDED WITH PLATING LAYERS

FIELD

The present disclosure relates to a semiconductor device with a semiconductor element, and a method for manufacturing such a semiconductor device.

BACKGROUND

In recent years, semiconductor devices of a leadless-package type such as an SON package (Small Outline Non-leaded package) type or a QFN package (Quad Flat Non-leaded package) type are widely used. Such a leadless-package semiconductor device is advantageous in terms of size and thickness reduction, because no external connection terminals project from the sealing resin covering the semiconductor element. An example of such a leadless-package semiconductor device is disclosed in JP-A-2016-18846.

The semiconductor device disclosed in the above document includes a semiconductor element, a lead frame, wires and a sealing resin. The lead frame is made of copper, for example. The lead frame includes a die pad and a plurality of lead parts. The die pad supports the semiconductor element. The lead parts are electrically connected to the semiconductor element with wires. The lead parts are the terminals for external connection and used for mounting the semiconductor device to a circuit board of an electronic device, for example. The sealing resin covers the semiconductor element.

Since the lead frame of the semiconductor device disclosed in the above document is made of copper, the lead frame may be oxidized in the atmosphere, so that an oxide film may be formed on the surface of the lead frame that is exposed from the sealing resin. Such a copper oxide film may have a poor solder wettability. Thus, when the semiconductor device is mounted to a circuit board of an electronic device with solder, the mounting strength may not be sufficient. Thus, such a semiconductor device has room for improvement in terms of the mounting strength to a circuit board, for example.

SUMMARY

The present disclosure has been proposed under the above-noted circumstances, and an object of the disclosure is to provide a semiconductor device capable of enhancing the mounting strength to a circuit board, and a method for manufacturing such a semiconductor device.

According to a first aspect of the disclosure, there is provided a semiconductor device that includes: a semiconductor element; a plurality of leads electrically connected to the semiconductor element, where each of the leads has a lead front surface and a lead back surface opposite to each other in a thickness direction, and one of the lead front surfaces supports the semiconductor element; a sealing resin that covers the semiconductor element and a portion of each of the leads; and a first plating layer and a second plating layer, where each plating layer is exposed from the sealing resin. Further, the sealing resin includes a resin side surface facing in a first direction perpendicular to the thickness direction, at least one of the leads has a lead end surface connected to the lead back surface and flush with the resin side surface, the first plating layer covers the lead back surface, the second plating layer covers the lead end surface and projects in the first direction relative to the resin side surface, and the second plating layer has an edge in a direction in which the lead back surface faces, where the edge overlaps with the first plating layer as viewed in the first direction.

According to a second aspect of the disclosure, there is provided a method for manufacturing a semiconductor device, the method may include the following steps. A semiconductor element is mounted on a front surface of a lead frame that includes a back surface opposite to the front surface in a thickness direction. A sealing resin is formed to cover the semiconductor element and a portion of the lead frame such that the back surface of the lead frame is exposed from the sealing resin. A first plating layer is formed by electroplating to cover the back surface of the lead frame. A protective tape is attached to cover the back surface of the lead frame and the first plating layer. The lead frame and the sealing resin are cut, with the protective tape attached, such that a resin side surface is formed on the sealing resin and a lead end surface is formed on the lead frame, where the resin side surface faces in a first direction perpendicular to the thickness direction, and the lead end surface is exposed from the resin side surface and flush with the resin side surface. A second plating layer is formed, with the protective tape attached, by electroless plating to cover the lead end surface.

Other features and advantages of the present disclosure will be more apparent by reading the detailed description below, with reference to the accompanying drawings.

DRAWINGS

FIG. 21 is a sectional view showing the semiconductor device according to the third embodiment;

FIG. 22 is a sectional view showing the semiconductor device according to the third embodiment;

FIG. 27 is a plan view showing a semiconductor device according to another variation.

EMBODIMENTS

Figure 1:
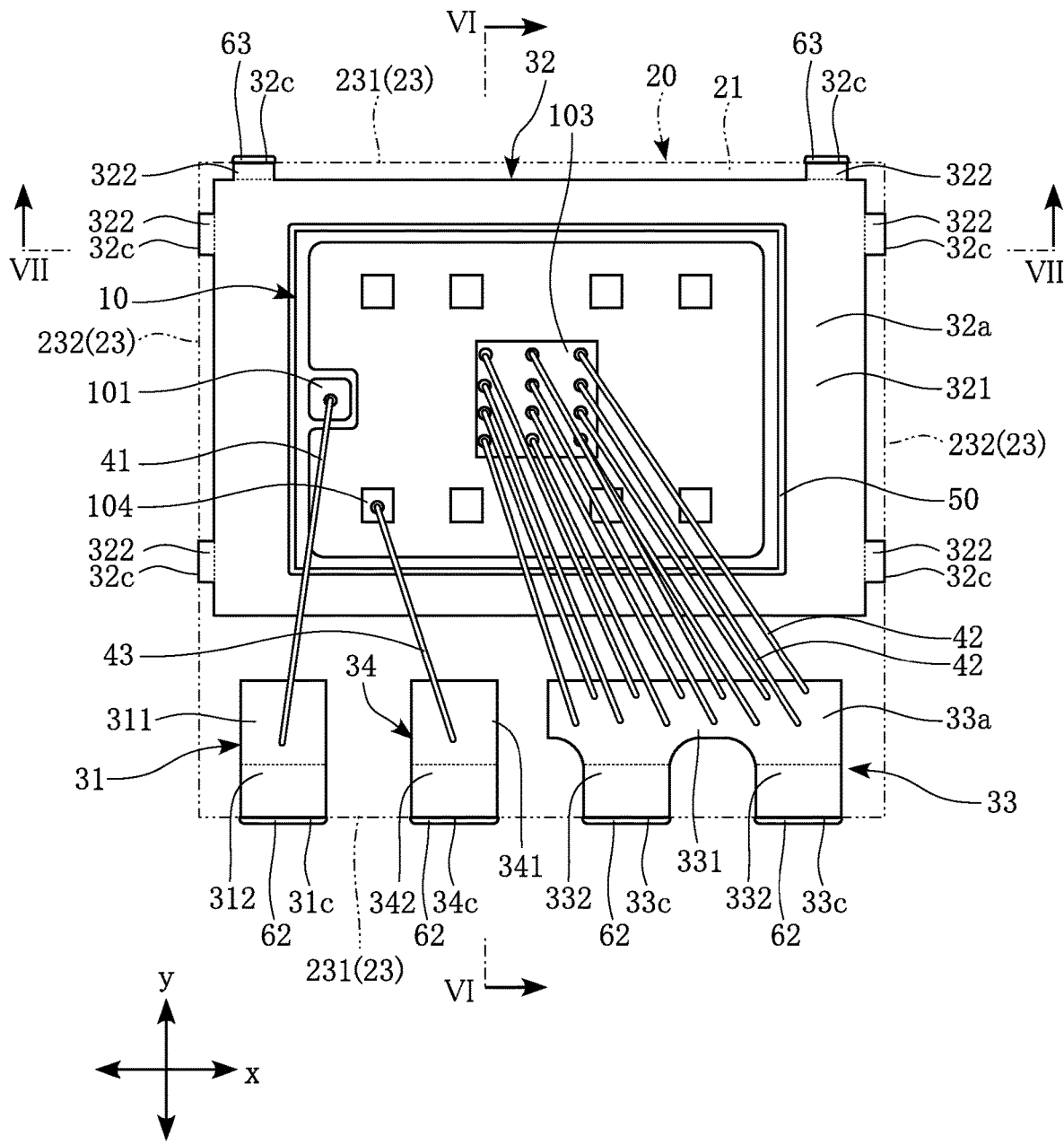
FIG. 1 is a plan view showing a semiconductor device according to a first embodiment.

Embodiments of a semiconductor device and a method for manufacturing the semiconductor device according to the present disclosure are described below with reference to the accompanying drawings.

FIGS. 1-7 show a semiconductor device according to a first embodiment. The semiconductor device A1 of the first embodiment includes a semiconductor element 10, a sealing resin 20, leads 31-34, first to third wires 41-43, an electrically conductive bonding material 50, a first plating layer 61 and a second plating layer 62.

Figure 2:
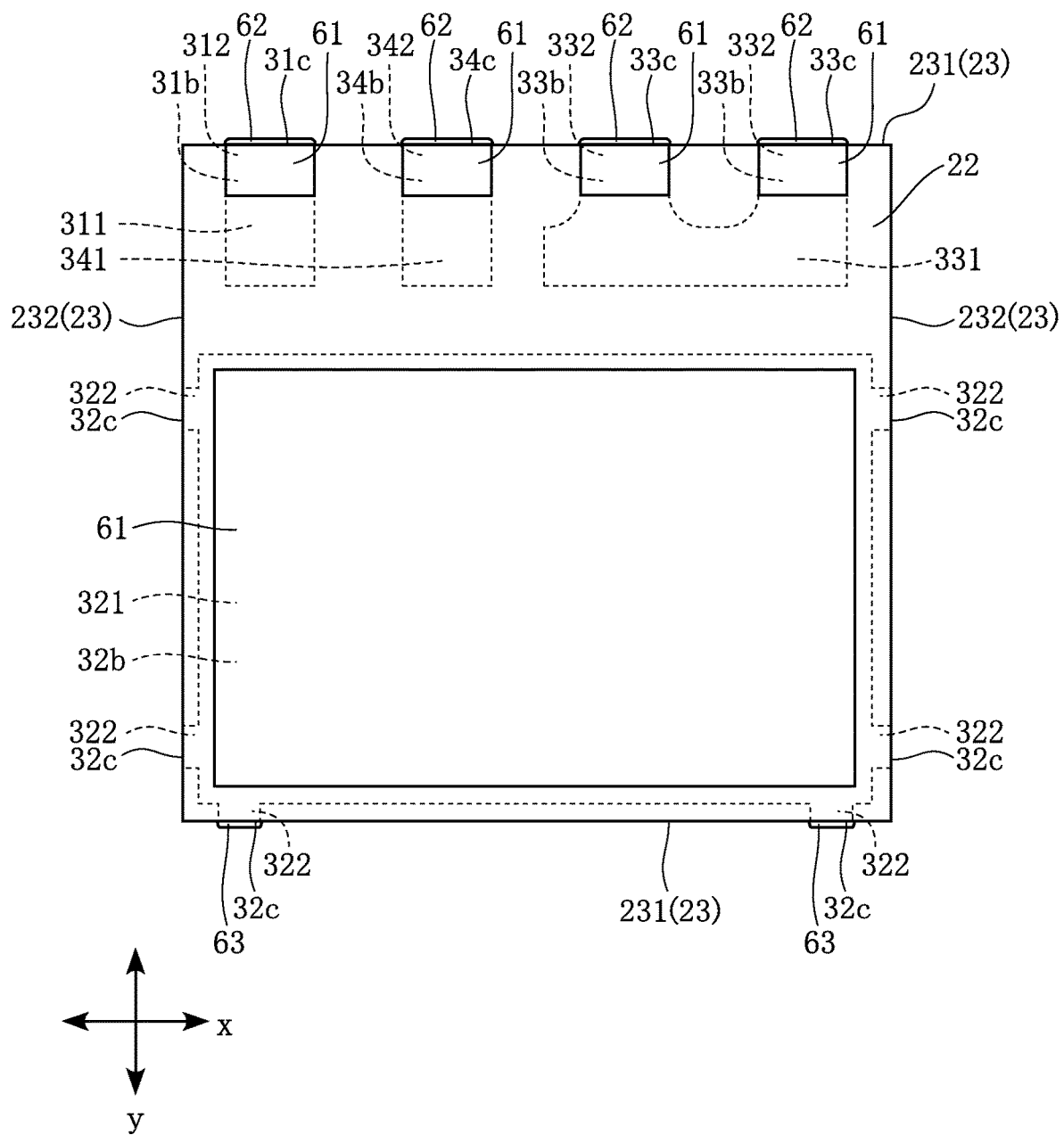
FIG. 2 is a bottom view showing the semiconductor device according to the first embodiment.
Figure 3:
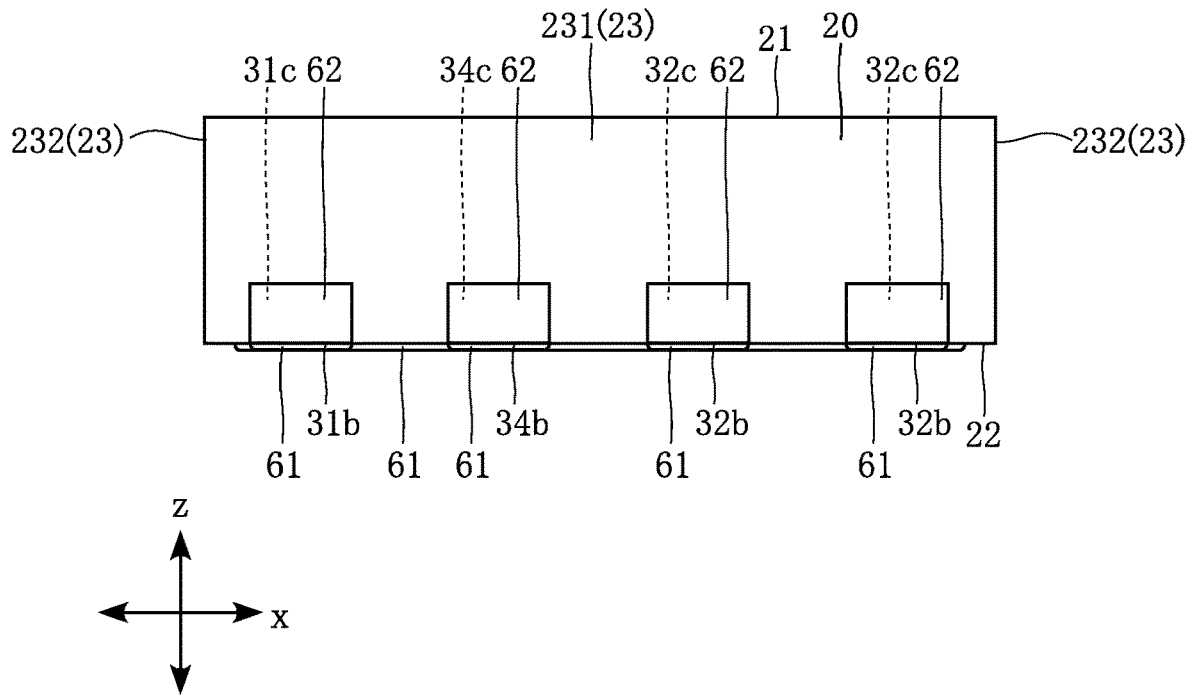
FIG. 3 is a front view showing the semiconductor device according to the first embodiment.
Figure 4:
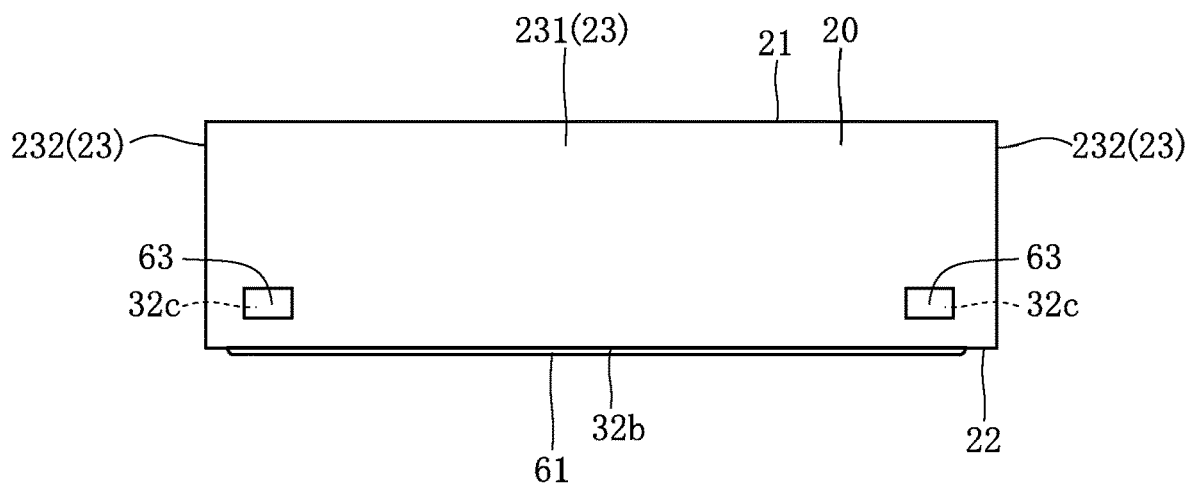
FIG. 4 is a rear view showing the semiconductor device according to the first embodiment.
Figure 5:
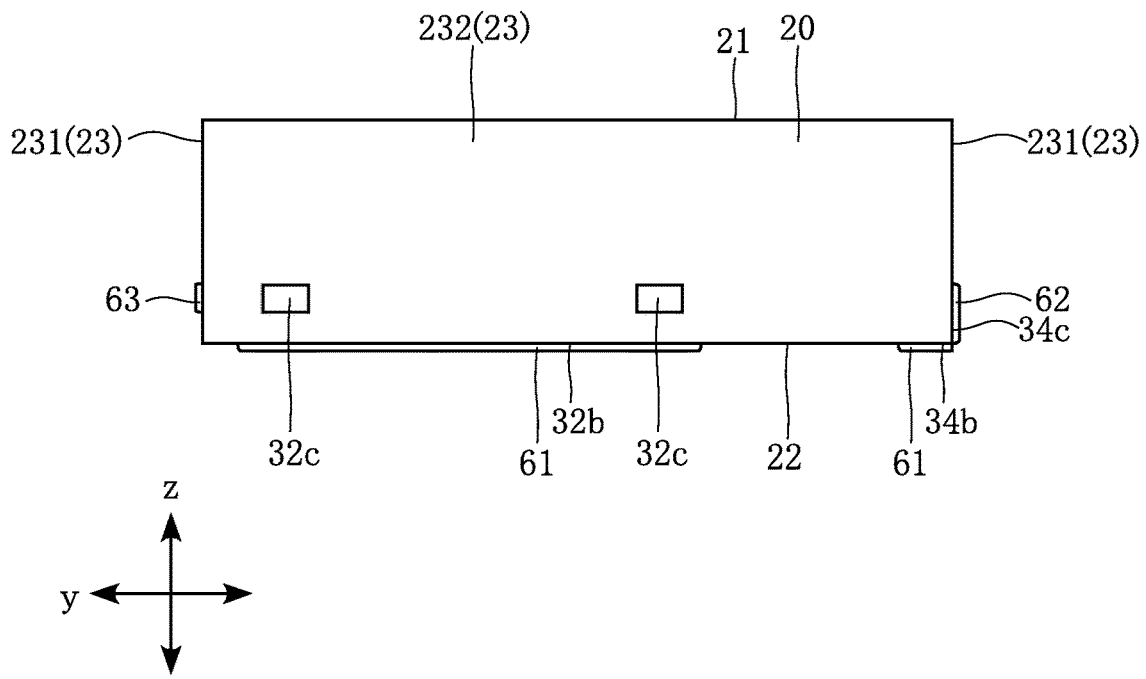
FIG. 5 is a side view (left side view) showing the semiconductor device according to the first embodiment.
Figure 6:
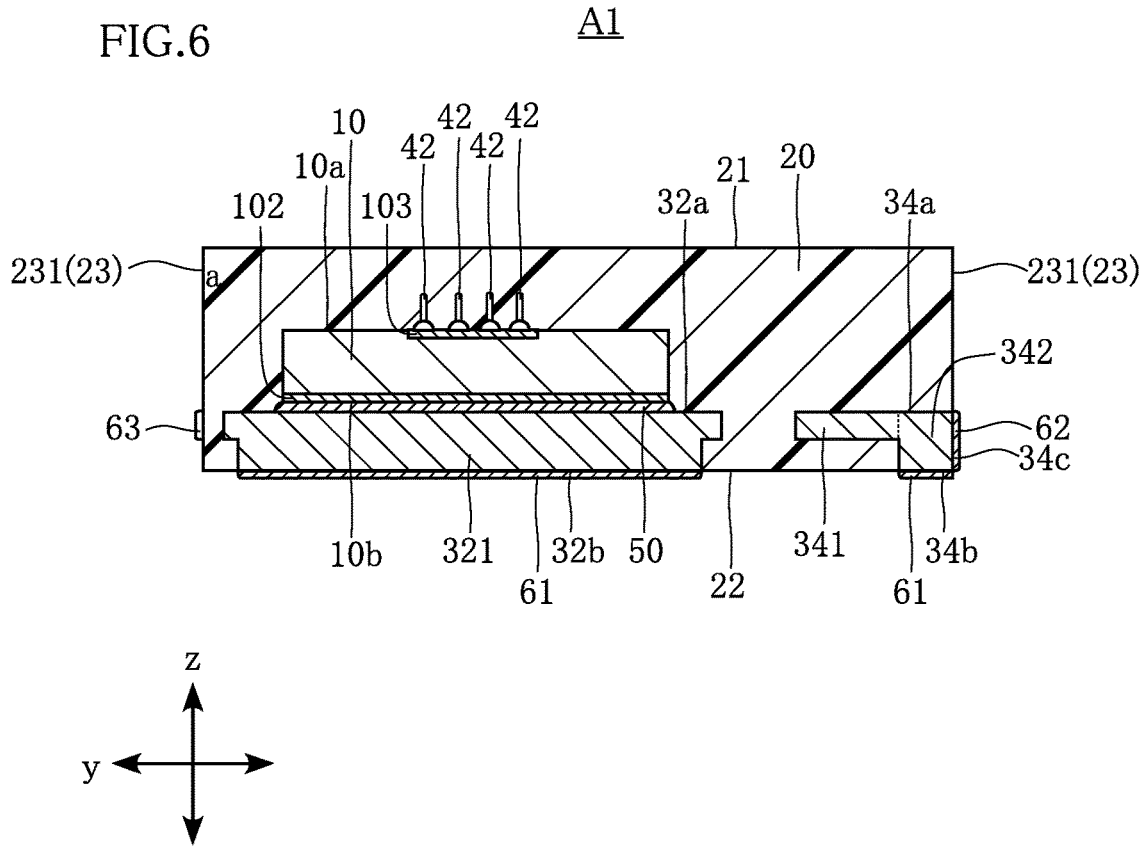
FIG. 6 is a sectional view taken along line VI-VI in FIG. 1.
Figure 7:
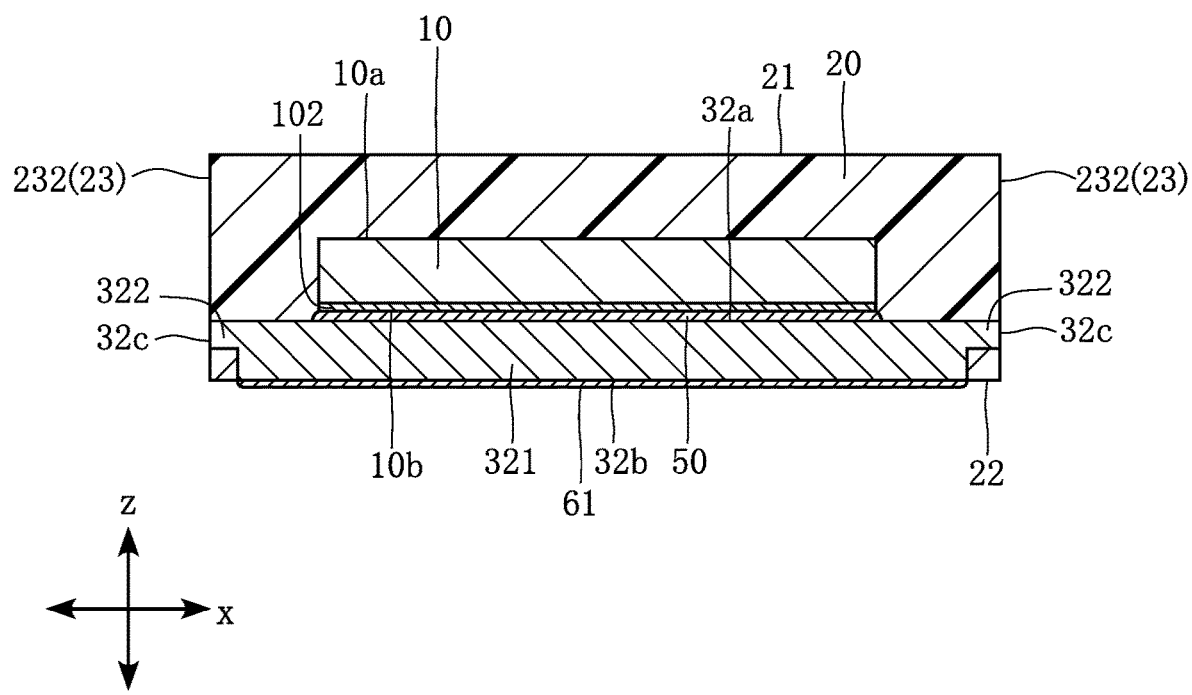
FIG. 7 is a sectional view taken along line VII-VII in FIG. 1.

FIG. 1 is a plan view showing the semiconductor device A1. In FIG. 1, the sealing resin 20 is illustrated by phantom lines (two-dot chain lines). FIG. 2 is a bottom view showing the semiconductor device A1. FIG. 3 is a front view of the semiconductor device A1, showing the semiconductor device A1 as viewed from the lower side in FIG. 1. FIG. 4 is a rear view of the semiconductor device A1, showing the semiconductor device A1 as viewed from the upper side in FIG. 1. FIG. 5 is a side view of the semiconductor device A1, showing the semiconductor device A1 as viewed from the left side in FIG. 1. FIG. 6 is a sectional view taken along line VI-VI in FIG. 1. FIG. 7 is a sectional view taken along line VII-VII in FIG. 1. In the present specification, the three directions perpendicular to each other are defined as x, y and z directions, respectively. The z direction is the thickness direction of the semiconductor device A1. The x direction is the horizontal direction in plan view of the semiconductor device A1. The y direction is the vertical direction in plan view of the semiconductor device A1.

The semiconductor device A1 is configured to be surface-mounted on a circuit board of various electronic devices. The semiconductor device A1 is a leadless-package device. That is, in the semiconductor device A1, the terminals used for mounting on a circuit board do not project from the sealing resin 20. In the present embodiment, the semiconductor device A1 is generally rectangular as viewed in the z direction (hereinafter referred to as "as viewed in plan"). The size of the semiconductor device A1 is not particularly limited. In the present embodiment, the semiconductor device A1 has a dimension of 1.8 to 15.0 mm in the x direction, 1.8 to 15.0 mm in the y direction and 0.7 to 5.5 mm in the z direction.

The semiconductor element 10 is chosen to fulfill the electric functions required for the semiconductor device A1. In the present embodiment, the semiconductor element 10 is a power MOSFET. However, the semiconductor element 10 is not limited to this. For example, the semiconductor element 10 may be an integrated circuit (IC) such as an LSI (Large Scale Integration) circuit, a voltage control element such as a LDO (Low Drop Out) regulator, an amplifying element such as an operational amplifier, or a discrete semiconductor such as a diode. Though the semiconductor device A1 includes a single semiconductor element 10 as shown in FIG. 1, the semiconductor device of the present disclosure may include two or more semiconductor elements 10. In the present embodiment, the semiconductor element 10 is rectangular as viewed in plan, as shown in FIG. 1. The semiconductor element 10 has an element front surface $10a$ and an element back surface $10b$.

The element front surface $10a$ and the element back surface $10b$ are opposite to each other and spaced apart from each other in the z direction. The element front surface $10a$ is formed with agate electrode 101 and a source electrode 103. The area of the gate electrode 101 is smaller than that of the source electrode 103. In the present embodiment, the element front surface $10a$ is also formed with a sense electrode 104. The sense electrode 104 is an electrode for detecting the current flowing through the semiconductor element 10. For example, the current that is in proportion to the source current of the semiconductor element 10 flows through the sense electrode 104. The element front surface $10a$ is covered with a passivation film (not shown) except the gate electrode 101, the source electrode 103 and the sense electrode 104. That is, in the element front surface $10a$, the gate electrode 101, the source electrode 103 and the sense electrode 104 are exposed from the passivation film. The element back surface $10b$ is formed with a drain electrode 102. In the present embodiment, when the semiconductor device A1 is mounted on a circuit board, the element back surface $10b$ faces the circuit board.

The sealing resin 20 covers the semiconductor element 10, portions of the leads 31-34, the wires 41-43, and the bonding material 50. For example, the sealing resin 20 is made of a black epoxy resin. In the present embodiment, the sealing resin 20 is rectangular as viewed in plan. The shape of the sealing resin 20 as viewed in plan is not limited to this. As shown in FIGS. 3-7, the sealing resin 20 has a resin front surface 21, a resin back surface 22 and a plurality of resin side surfaces 23.

The resin front surface 21 and the resin back surface 22 are opposite to each other in the z direction. The resin front surface 21 faces in the direction in which the element front surface $10a$ faces. The resin back surface 22 faces in the direction in which the element back surface $10b$ faces. The resin side surfaces 23 are connected to the resin front surface 21 and the resin back surface 22. As shown in FIGS. 3-7, in the present embodiment, the resin side surfaces 23 are flat and perpendicular to both of the resin front surface 21 and the resin back surface 22. The resin side surfaces 23 may be slightly inclined with respect to the z direction. In the present embodiment, as shown in FIGS. 1 and 2, the resin side surfaces 23 include a pair of first resin side surfaces 231 and a pair of second resin side surfaces 232. The paired first resin side surfaces 231 are opposite to each other and spaced apart from each other in the y direction. The paired second resin side surfaces 232 are opposite to each other and spaced apart from each other in the x direction.

The leads 31-34 may support the semiconductor element 10 and are electrically connected to the semiconductor element 10. Hereinafter, the leads 31-34 maybe individually referred to as the first lead 31, the second lead 32, the third lead 33 and the fourth lead 34. The leads 31-34 may be formed by punching, bending or cutting a metal plate. The leads 31-34 are made of metal. In the present embodiment, the main material for the leads 31-34 is copper (Cu). The leads 31-34 maybe made of nickel (Ni), a Cu or Ni alloy, or 42 alloy. Each of the leads 31-34 may be 0.20 to 0.30 mm in thickness. The first lead 31, the second lead 32, the third lead 33 and the fourth lead 34 are spaced apart from each other. As shown in FIGS. 1 and 2, the first lead 31, the third lead 33 and the fourth lead 34 are aligned in the x direction.

The first lead 31 has a first lead front surface 31a, a first lead back surface 31b and a first lead end surface 31c. The first lead front surface 31a and the first lead back surface 31b are opposite to each other and spaced apart from each other in the z direction. The first lead front surface 31a faces in the direction in which the element front surface 10a faces. The first lead back surface 31b faces in the direction in which the element back surface 10b faces. The first lead back surface 31b is exposed from the sealing resin 20 (the resin back surface 22). The first lead end surface 31c is connected to the first lead front surface 31a and the first lead back surface 31b. The first lead end surface 31c is exposed from the sealing resin 20 (a resin side surface 23). Specifically, in the present embodiment, the first lead end surface 31c is exposed from one of the first resin side surfaces 231 (the lower one in FIG. 1). The first lead end surface 31c is flush with the first resin side surface 231.

The first lead 31 includes a first bonding pad part 311 and a first terminal part 312. The thickness of the first bonding pad part 311 is smaller than that of the first terminal part 312.

To the first bonding pad part 311 is bonded the first wire 41. The upper surface of the first bonding pad part 311 is a portion of the first lead front surface 31a. As shown in FIG. 1, the first wire 41 is bonded to the upper surface of the first bonding pad part 311. As shown in FIG. 2, the lower surface of the first bonding pad part 311 is covered with the sealing resin 20.

The first terminal part 312 is rectangular as viewed in plan. The upper surface of the first terminal part 312 is a portion of the first lead front surface 31a. The lower surface of the first terminal part 312 is the first lead back surface 31b. The first terminal part 312 has a surface exposed from the one of the first resin side surfaces 231, and the exposed surface is the first lead end surface 31c.

The second lead 32 has a second lead front surface 32a, a second lead back surface 32b and a plurality of second lead end surfaces 32c. The second lead front surface 32a and the second lead back surface 32b are opposite to each other and spaced apart from each other in the z direction. The second lead front surface 32a faces in the direction in which the element front surface 10a faces. The second lead back surface 32b faces in the direction in which the element back surface 10b faces, and is exposed from the sealing resin 20 (the resin back surface 22). The second lead end surfaces 32c are connected to the second lead front surface 32a and the second lead back surface 32b and exposed from the resin side surfaces 23. In the present embodiment, the second lead end surfaces 32c include two second lead end surfaces 32c exposed from one of the first resin side surfaces 231 (the upper one in FIG. 1), two second lead end surfaces 32c exposed from one of the second resin side surfaces 232, and two second lead end surfaces 32c exposed from the other one of the second resin side surfaces 232. Each of the second lead end surfaces 32c is flush with the resin side surface 23 from which the second lead end surface 32c is exposed. In this way, as shown in FIGS. 1 and 2, the second lead end surfaces 32c include the second lead end surfaces 32c facing in the x direction and the second lead end surfaces 32c facing to one side in the y direction.

The second lead 32 includes a second bonding pad part 321 and a plurality of extensions 322. The thickness of the second bonding pad part 321 is larger than that of the extensions 322.

To the second bonding pad part 321 is mounted the semiconductor element 10. The second bonding pad part 321 functions as a die pad. The upper surface of the second bonding pad part 321 is a portion of the second lead front surface 32a. As shown in FIG. 1, the semiconductor element 10 is mounted on the upper surface of the second bonding pad part 321. A portion of the lower surface of the second bonding pad part 321 is the second lead back surface 32b. As shown in FIG. 2, the portion of the lower surface of the second bonding pad part 321 is exposed from the resin back surface 22.

The extensions 322 project from the periphery of the second bonding pad part 321 as viewed in plan. The upper surface of each extension 322 is a portion of the second lead front surface 32a. The lower surface of each extension 322 is covered with the sealing resin 20. The extensions 322 have surfaces exposed from the resin side surfaces 23, and the exposed surfaces are the second lead end surfaces 32c.

The third lead 33 has a third lead front surface 33a, a third lead back surface 33b and third lead end surfaces 33c. The third lead front surface 33a and the third lead back surface 33b are opposite to each other and spaced apart from each other in the z direction. The third lead front surface 33a faces in the direction in which the element front surface 10a faces. The third lead back surface 33b faces in the direction in which the element back surface 10b faces, and is exposed from the sealing resin 20 (the resin back surface 22). The third lead end surfaces 33c are connected to the third lead front surface 33a and the third lead back surface 33b and exposed from the sealing resin 20 (a resin side surface 23). Specifically, in the present embodiment, the third lead end surfaces 33c are exposed from one of the first resin side surfaces 231 (the lower one in FIG. 1). The third lead end surfaces 33c are flush with the first resin side surface 231.

The third lead 33 includes a third bonding pad part 331 and a plurality of third terminal parts 332. In the present embodiment, the third lead 33 includes two third terminal parts 332. The thickness of the third bonding pad part 331 is smaller than that of the third terminal parts 332.

To the third bonding pad part 331 are bonded the second wires 42. The upper surface of the third bonding pad part 331 is a portion of the third lead front surface 33a. As shown in FIG. 1, the second wires 42 are bonded to the upper surface of the third bonding pad part 331. As shown in FIG. 2, the lower surface of the third bonding pad part 331 is covered with the sealing resin 20. In the present embodiment, the third bonding pad part 331 is elongate in the x direction as viewed in plan.

The third terminal parts 332 are rectangular as viewed in plan. The third terminal parts 332 are spaced apart from each other as viewed in plan. The upper surface of each third terminal part 332 is a portion of the third lead front surface 33a. The lower surface of each third terminal part 332 is a portion of the third lead back surface 33b. Each third terminal part 332 has a surface exposed from a resin side surface 23 (one of the first resin side surfaces 231), and the exposed surfaces are the third lead end surfaces 33c.

The fourth lead 34 has a fourth lead front surface 34a, a fourth lead back surface 34b and a fourth lead end surface 34c. The fourth lead front surface 34a and the fourth lead back surface 34b are opposite to each other and spaced apart from each other in the z direction. The fourth lead front surface 34*a* faces in the direction in which the element front surface 10*a* faces. The fourth lead back surface 34*b* faces in the direction in which the element back surface 10*b* faces, and is exposed from the sealing resin 20 (the resin back surface 22). The fourth lead end surface 34*c* is connected to the fourth lead front surface 34*a* and the fourth lead back surface 34*b* and exposed from a resin side surface 23. Specifically, in the present embodiment, the fourth lead end surface 34*c* is exposed from one of the first resin side surfaces 231 (the lower one in FIG. 1). The fourth lead end surface 34*c* is flush with the first resin side surface 231. Thus, in the present embodiment, all of the first lead end surface 31*c*, the third lead end surfaces 33*c* and the fourth lead end surface 34*c* are exposed from the first resin side surface 231 on the lower side in FIG. 1 and flush with that first resin side surface 231.

The fourth lead 34 includes a fourth bonding pad part 341 and a fourth terminal part 342. The thickness of the fourth bonding pad part 341 is smaller than that of the fourth terminal part 342.

To the fourth bonding pad part 341 is bonded the third wire 43. The upper surface of the fourth bonding pad part 341 is a portion of the fourth lead front surface 34*a*. As shown in FIG. 1, the third wire 43 is bonded to the upper surface of the fourth bonding pad part 341. As shown in FIG. 2, the lower surface of the fourth bonding pad part 341 is covered with the sealing resin 20.

The fourth terminal part 342 is rectangular as viewed in plan. The upper surface of the fourth terminal part 342 is a portion of the fourth lead front surface 34*a*. The lower surface of the fourth terminal part 342 is the fourth lead back surface 34*b*. The fourth terminal part 342 has a surface exposed from a resin side surface 23 (one of the first resin side surfaces 231), and the exposed surface is the fourth lead end surface 34*c*.

All of the first wire 41, the second wires 42 and the third wire 43 are electrically conductive linear parts. For example, the first wire 41, the second wires 42 and the third wire 43 are made of copper (Cu), gold (Au) or aluminum (Al).

As shown in FIG. 1, the first wire 41 has one end bonded to the first bonding pad part 311 and another end bonded to the gate electrode 101, thereby electrically connecting the first bonding pad part 311 and the gate electrode 101 to each other. Thus, in the semiconductor device A1, the first terminal part 312 functions as a gate terminal.

As shown in FIG. 1, each of the second wires 42 has one end bonded to the third bonding pad part 331 and another end bonded to the source electrode 103, thereby electrically connecting the third bonding pad part 331 and the source electrode 103 to each other. Thus, in the semiconductor device A1, the third terminal parts 332 function as a source terminal. Note that the number of the second wires 42 is not limited to that shown in FIG. 1.

As shown in FIG. 1, the third wire 43 has one end bonded to the fourth bonding pad part 341 and another end bonded to the sense electrode 104, thereby electrically connecting the fourth bonding pad part 341 and the sense electrode 104 to each other. Thus, in the semiconductor device A1, the fourth terminal part 342 functions as a sense terminal.

The electrically conductive bonding material 50 is an electrical conductor such as solder or silver (Ag) paste. The electrically conductive bonding material 50 is interposed between the semiconductor element 10 (the element back surface 10*b*) and the second lead 32 (the second bonding pad part 321) and electrically connects these parts to each other. Specifically, in the present embodiment, the electrically conductive bonding material 50 electrically connects the drain electrode 102 formed on the element back surface 10*b* and the second bonding pad part 321 to each other. Thus, in the semiconductor device A1, the second lead back surface 32*b* functions as a drain terminal.

The first plating layer 61 is a metal film exposed from the sealing resin 20. Specifically, the first plating layer 61 is exposed from the resin back surface 22. The first plating layer 61 covers the first lead back surface 31*b*, the second lead back surface 32*b*, the third lead back surface 33*b* and the fourth lead back surface 34*b*. The first plating layer 61 projects from the resin back surface 22 in the z direction. The first plating layer 61 is formed by electroplating. The first plating layer 61 is made of a material having a higher solder wettability than the material for the leads 31-34. In the present embodiment, the main material for the first plating layer 61 is tin (Sn).

The second plating layer 62 is a metal film exposed from the sealing resin 20. As shown in FIGS. 1-3, 5 and 6, the second plating layer 62 is exposed from a resin side surface 23 (one of the first resin side surfaces 231) and covers the first lead end surface 31*c*, the third lead end surfaces 33*c* and the fourth lead end surface 34*c*. In the present embodiment, the first lead end surface 31*c*, the third lead end surfaces 33*c* and the fourth lead end surface 34*c* are flush with the first resin side surface 231. Thus, the second plating layer 62 projects from the resin side surface 23 (the first resin side surface 231) in the y direction. As shown in FIGS. 5 and 6, the edge of the second plating layer 62 on a first side in the z direction (i.e., the lower edge in FIGS. 5 and 6) overlaps with the first plating layer 61 as viewed in the y direction. Specifically, in the present embodiment, the edge of the second plating layer 62 on the first side in the z direction coincides in position with the edge of the first plating layer 61 on the second side opposite to the first side in the z direction (i.e., the upper edge in FIGS. 5 and 6), as viewed in the y direction. Note that the first lead end surface 31*c*, the third lead end surfaces 33*c*, the fourth lead end surface 34*c* and the first resin side surface 231 are rougher than the surface of the second plating layer 62, because these surfaces are formed by blade dicing (described later).

The second plating layer 62 is formed by electroless plating. The second plating layer 62 is made of a material having a higher solder wettability than the material for the leads 31-34. In the present embodiment, the second plating layer 62 is made up of a Ni layer, a Pd layer and a Au layer that are laminated. The Ni layer is held in contact with the first lead end surface 31*c*, the third lead end surfaces 33*c* and the fourth lead end surface 34*c*, and is 0.1 to 3.0 μm in thickness. The Pd layer is interposed between the Ni layer and the Au layer and is 0.01 to 0.2 μm in thickness. The Au layer is held in contact with the Pd layer and is 0.01 to 0.1 μm in thickness. The Au layer is exposed to the outside of the semiconductor device A1. The material and thickness of the second plating layer 62 are not limited to those described above. The second plating layer 62 may be made of a Au layer alone or a lamination of a Ni layer and a Au layer.

The third plating layer 63 is a metal film exposed from the sealing resin 20. As shown in FIGS. 1, 2 and 4-6, the third plating layer 63 is exposed from a resin side surface 23 (one of the first resin side surfaces 231) and covers the second lead end surfaces 32*c* that face in the y direction. As shown in FIGS. 1 and 2, as viewed in plan, the second plating layer 62 and the third plating layer 63 are opposite to each other across the sealing resin 20. The third plating layer 63 is formed by electroless plating. In the present embodiment, the third plating layer 63 is made of the same material as that for the second plating layer 62. Thus, the third plating layer 63 is made up of a Ni layer, a Pd layer and a Au layer that are laminated. The thicknesses of these layers are also substantially the same as those of the second plating layer 62.

A method for manufacturing the semiconductor device A1 is described below with reference to FIGS. 8-17. FIGS. 8, 9, 13, 15 and 17 are plan views showing the steps of a method for manufacturing the semiconductor device A1. Note that illustration of the sealing resin 20 is omitted in FIGS. 13, 15 and 17. FIGS. 10-12, 14 and 16 are sectional views showing the steps of the method for manufacturing the semiconductor device A1. FIG. 10 is a sectional view taken along line X-X in FIG. 9 and corresponds to the cross section shown in FIG. 6. Other sectional views are along the same plane as FIG. 10.

Figure 8:
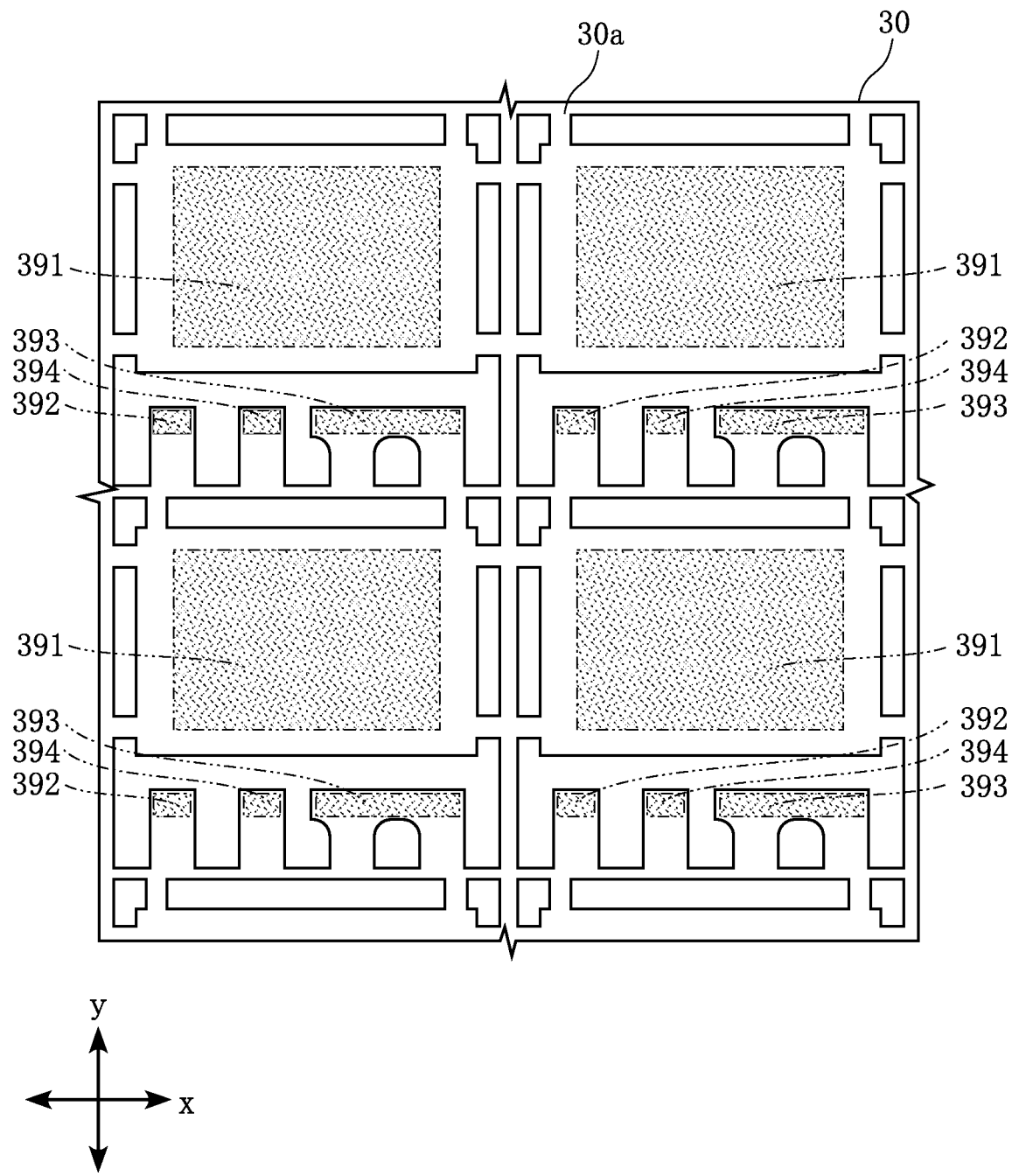
FIG. 8 is a plan view showing a step of a method for manufacturing the semiconductor device of FIG. 1.

First, a lead frame 30 is prepared, as shown in FIG. 8. The lead frame 30 is a plate-like member to later become the first lead 31, the second lead 32, the third lead 33 and the fourth lead 34. The lead frame 30 is mainly made of Cu. The lead frame 30 has a lead front surface 30a and a lead back surface 30b. The lead frame 30 is may be formed by punching or bending a metal plate into the shape shown in FIG. 8.

Figure 9:
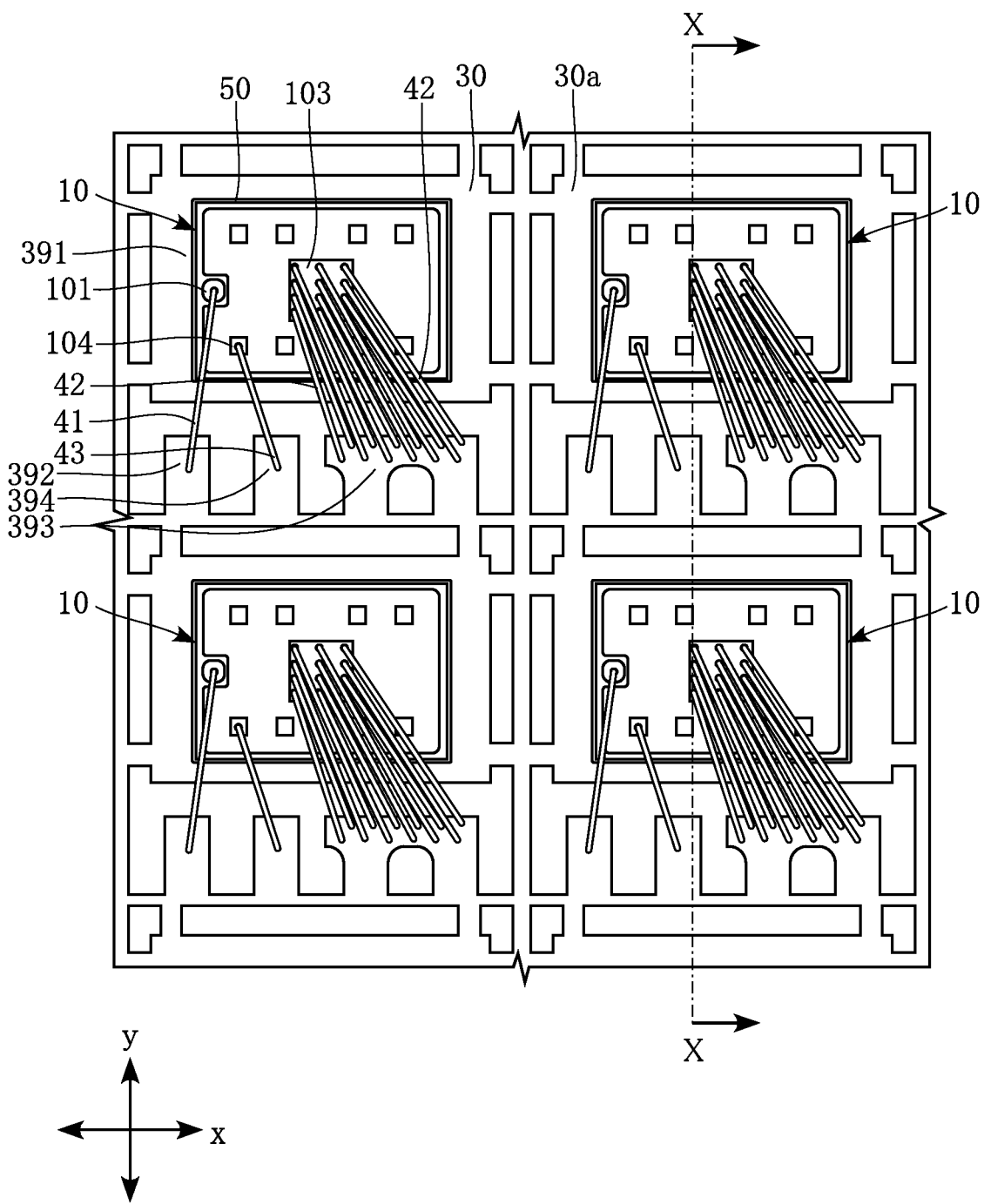
FIG. 9 is a plan view showing a step of the method for manufacturing the semiconductor device of FIG. 1.
Figure 10:
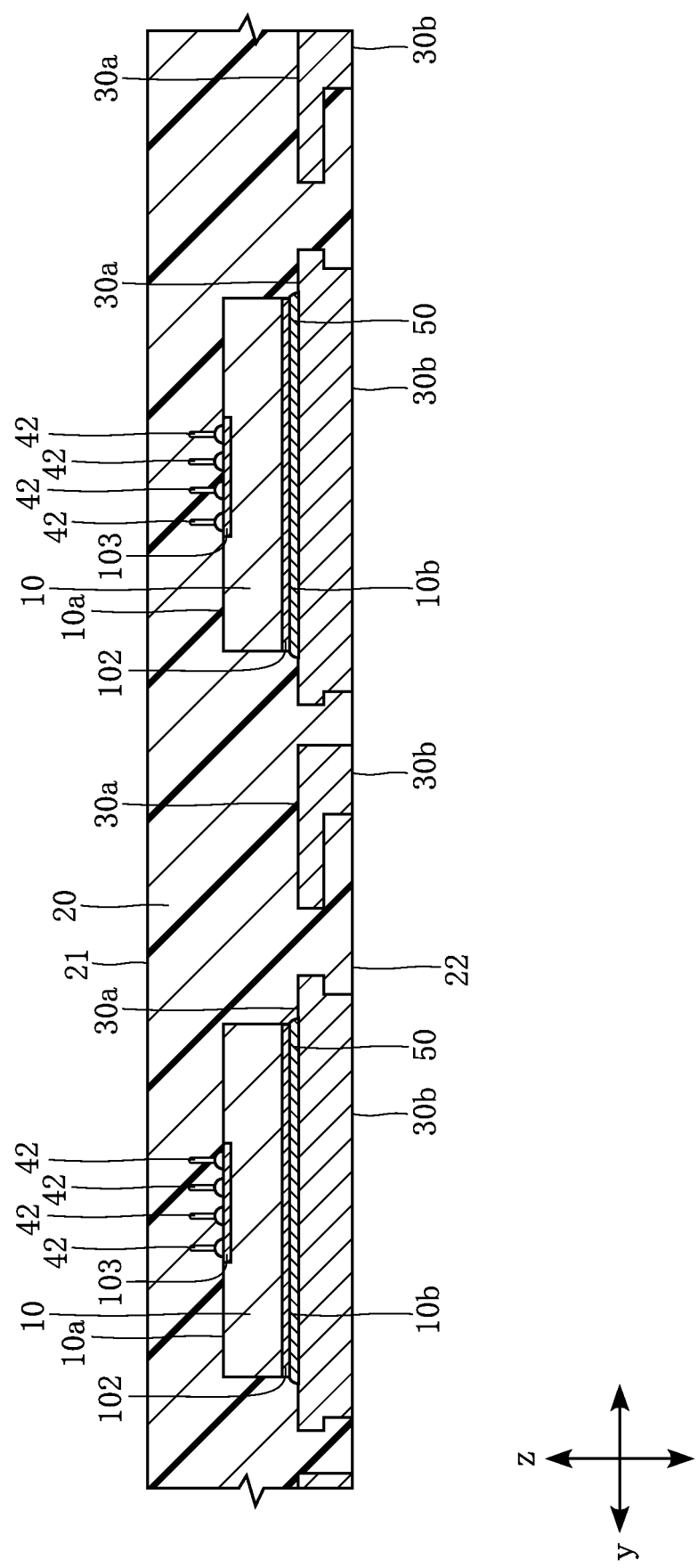
FIG. 10 is a sectional view showing a step of the method for manufacturing the semiconductor device of FIG. 1.

Then, as shown in FIG. 9, semiconductor elements 10 are mounted to the lead frame 30. Each of the semiconductor elements 10 has an element front surface 10a and an element back surface 10b. The element front surface 10a is formed with a gate electrode 101, a source electrode 103 and a sense electrode 104. The element back surface 10b is formed with a drain electrode 102. In this step of mounting the semiconductor elements 10, an electrically conductive bonding material 50 is first applied to element bonding regions 391 (indicated by small dots in FIG. 8) in the lead front surface 30a. Then, the semiconductor elements 10 are placed on the electrically conductive bonding material 50, with each element back surface 10b facing the lead front surface 30a. Thus, the electrically conductive bonding material 50 is sandwiched between the lead front surface 30a and each of the element back surfaces 10b. Next, the electrically conductive bonding material 50 is melted by reflowing and then cooled to solidify, whereby the semiconductor elements 10 are bonded to the lead frame 30. When the mounting of the semiconductor elements 10 is completed in this way, the drain electrode 102 on the element back surface 10b of each semiconductor element 10 is electrically connected to the lead frame 30.

Next, as shown in FIG. 9, the first wires 41, the second wires 42 and the third wires 43 are bonded. Specifically, first wires 41 are bonded to the gate electrodes 101 and the wire bonding regions 392 shown in FIG. 8. Second wires 42 are bonded to the source electrodes 103 and the wire bonding regions 393 shown in FIG. 8. The third wires 43 are bonded to the sense electrodes 104 and the wire bonding regions 394 shown in FIG. 8. (The wire bonding regions 392, 393 and 394 are indicated by small dots in FIG. 8.) Note that the order of bonding the first wires 41, the second wires 42 and the third wires 43 are not limited. A known wire bonder may be used to bond the wires 41, 42 and 43. The first wires 41, the second wires 42 and the third wires 43 may be made of copper (Cu), gold (Au) or aluminum (Al).

Next, as shown in FIG. 10, a sealing resin 20 is formed to cover the semiconductor elements 10, portions of the lead frame 30, the first wires 41, the second wires 42 and the third wires 43. The sealing resin 20 maybe formed by known transfer molding techniques using a mold. Specifically, the lead frame 30 after the wire bonding step is set in a mold, and liquefied resin material is loaded into the cavity in the mold. In this step, the lead back surface 30b is held in contact with the mold. Then, the resin material is hardened. As a result, the sealing resin 20 having a resin front surface 21 and a resin back surface 22 is formed. In the present embodiment, black epoxy resin is used as the resin material. However, the resin material is not limited to this. In the present embodiment, the sealing resin 20 is formed on the entire region shown in FIG. 9. Since the lead back surface 30b is held in contact with the mold during the molding process, the lead back surface 30b is not covered with the sealing resin 20 but becomes flush with the resin back surface 22, as shown in FIG. 10.

Figure 11:
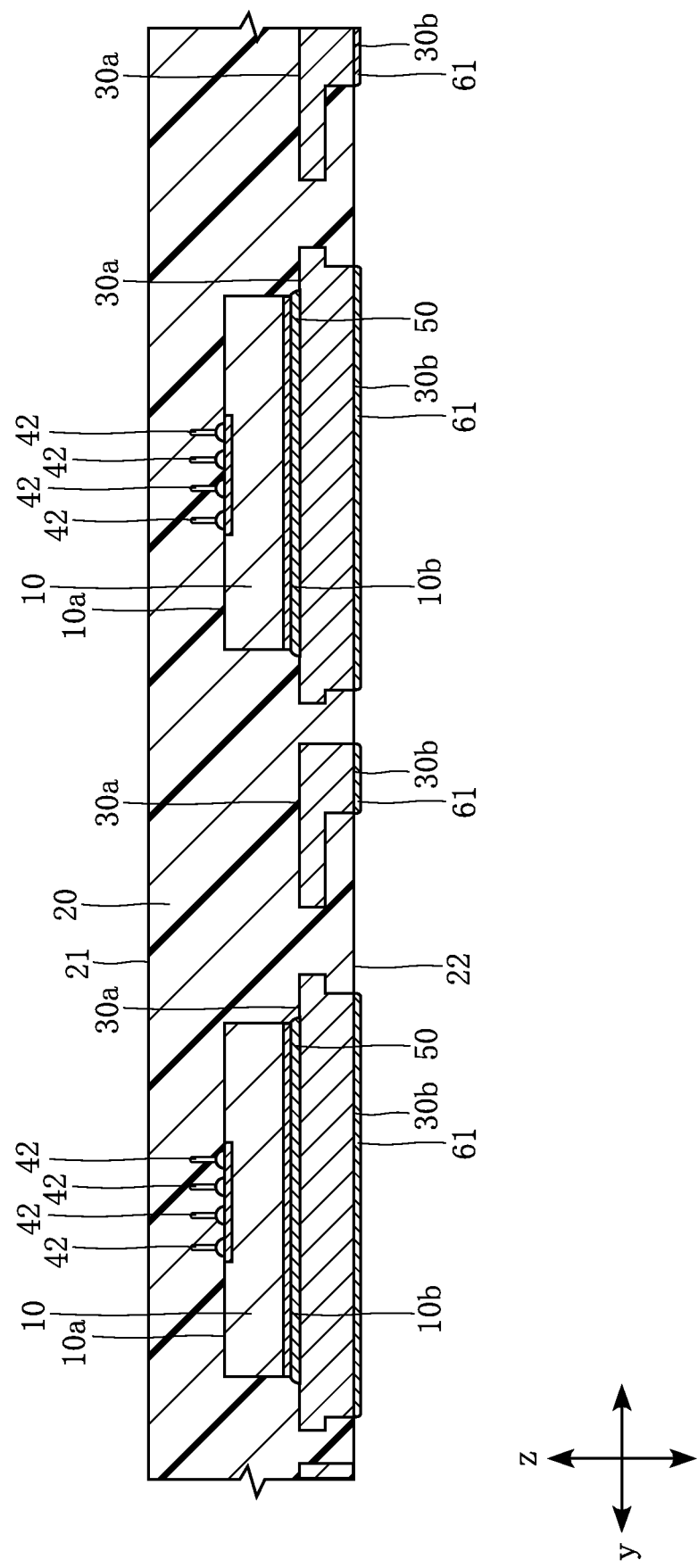
FIG. 11 is a sectional view showing a step of the method for manufacturing the semiconductor device of FIG. 1.

Next, as shown in FIG. 11, a first plating layer 61 is formed on the lead back surface 30b. The first plating layer 61 is formed by electroplating using the lead frame 30 as a conduction path. Specifically, electroplating is performed, with the lead frame 30 after the resin forming step immersed in a plating solution, using the lead frame 30 as a conduction path. As a result, a metal layer of a type corresponding to the plating solution is deposited on the lead back surface 30b exposed from the sealing resin 20. Thus, the first plating layer 61 is formed. In the present embodiment, the first plating layer 61 is a metal layer mainly made of Sn. Since the lead frame 30 has not been cut at this stage, the current flows through the entirety of the lead frame 30 shown in FIG. 9 during the electroplating.

Figure 12:
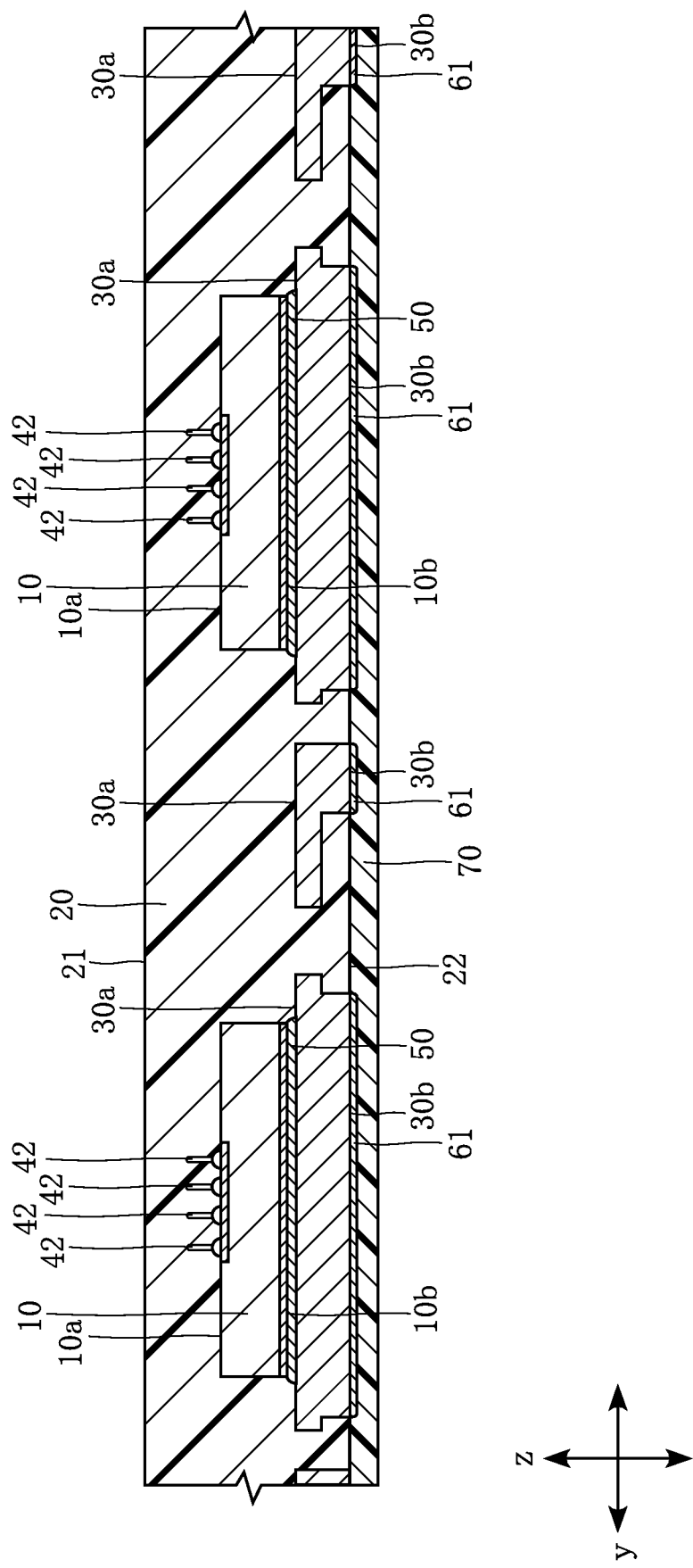
FIG. 12 is a sectional view showing a step of the method for manufacturing the semiconductor device of FIG. 1.

Next, as shown in FIG. 12, a protective tape 70 is attached from the lead back surface 30b side of the lead frame 30. The protective tape 70 is an adhesive tape and has acid and alkali resistance. Thus, the protective tape 70 will not be damaged by immersion in chemical solutions or application of chemical solutions in the following manufacturing process. The protective tape 70 is attached to cover the entirety of the first plating layer 61 and the resin back surface 22.

Figure 13:
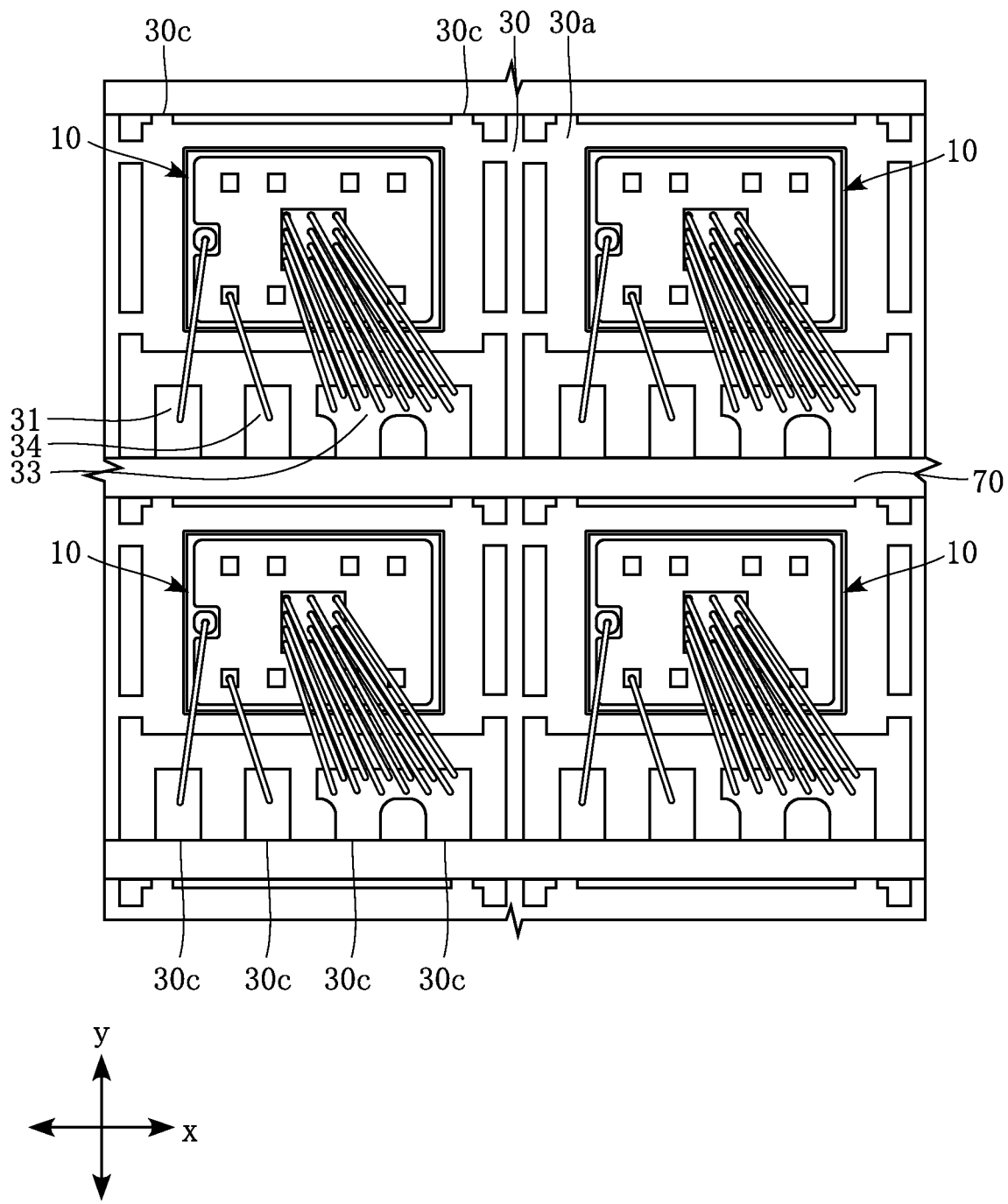
FIG. 13 is a plan view showing a step of the method for manufacturing the semiconductor device of FIG. 1.
Figure 14:
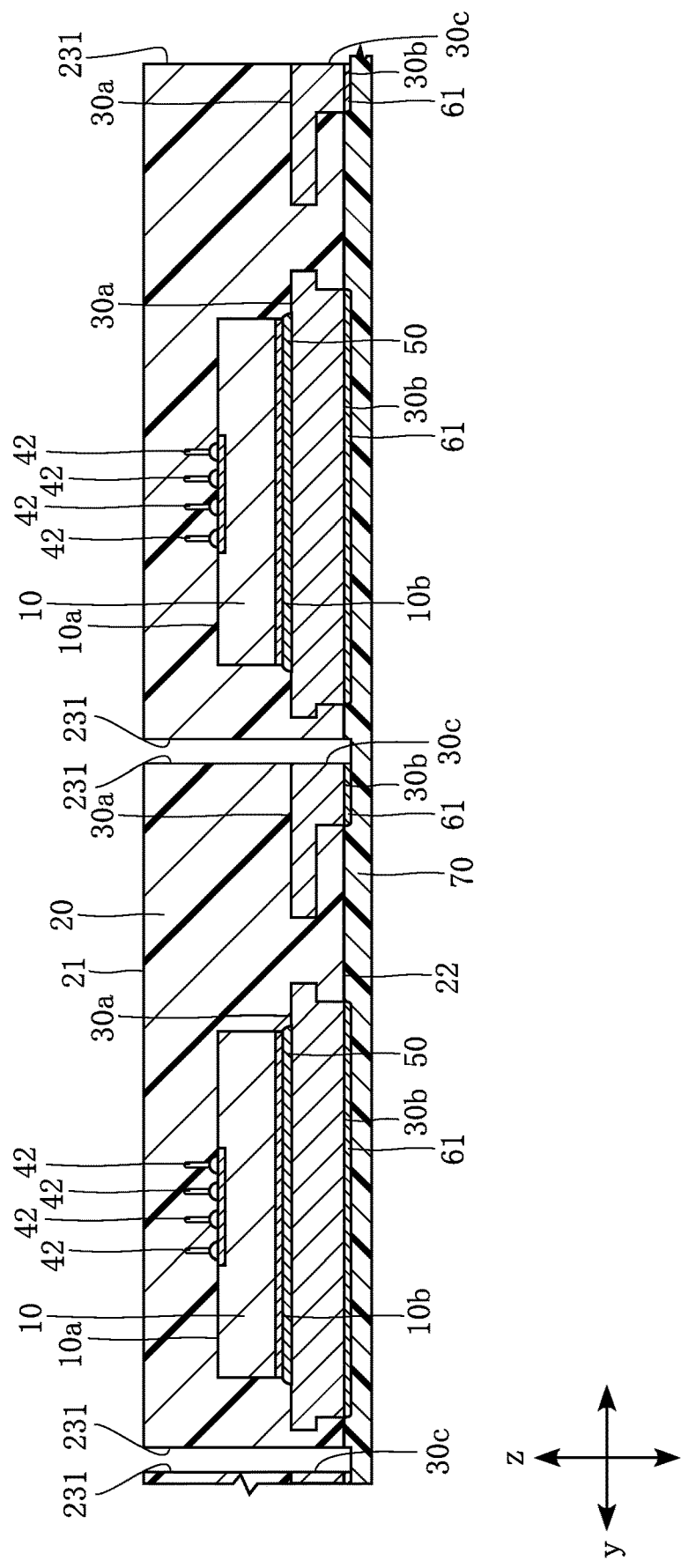
FIG. 14 is a sectional view showing a step of the method for manufacturing the semiconductor device of FIG. 1.

Next, as shown in FIGS. 13 and 14, the sealing resin 20 and the lead frame 30 are cut along the x direction. (At this stage, the protective tape 70 is not cut.) For example, this cutting step (hereinafter referred to as the first cutting step) is performed by blade dicing. Instead of blade dicing, plasma dicing or laser dicing may be employed. As shown in FIGS. 13 and 14, by the first cutting step, the resin side surfaces 23 (first resin side surfaces 231) and lead end surfaces 30c that face in the y direction are formed. The thus-formed first resin side surfaces 231 and the lead end surfaces 30c are flush with each other. The first resin side surfaces 231 and the lead end surfaces 30c formed by blade dicing have a surface roughness that depends on the grindstone for the dicing blade. By this first cutting step, the lead frame 30 is divided in the y direction, and the first leads 31, the third leads 33 and the fourth leads 34 are separated from the lead frame 30. At this stage, the portions of the lead frame 30 which are later to become the second leads 32 are still connected to each other in the x direction.

Figure 15:
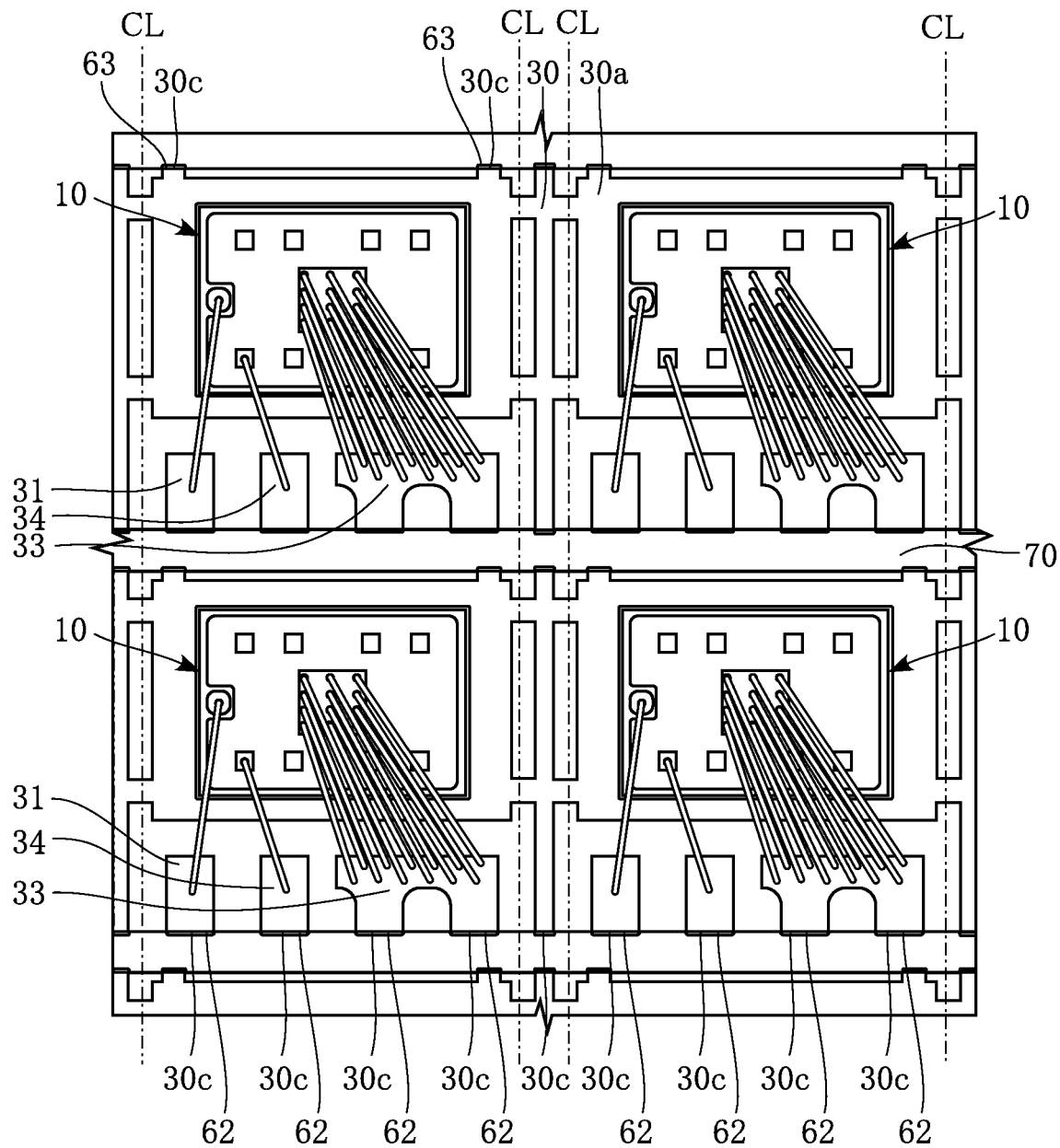
FIG. 15 is a plan view showing a step of the method for manufacturing the semiconductor device of FIG. 1.
Figure 16:
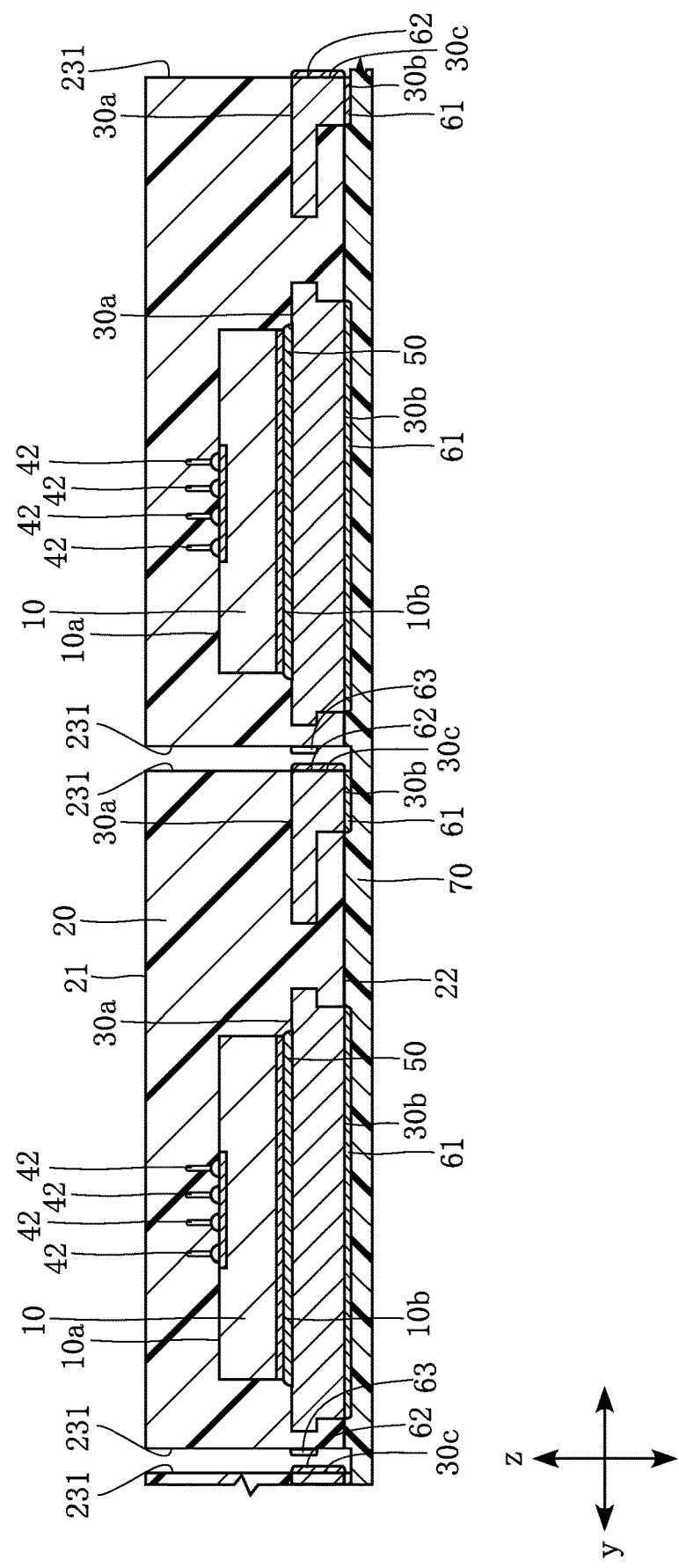
FIG. 16 is a sectional view showing a step of the method for manufacturing the semiconductor device of FIG. 1.

Then, as shown in FIGS. 15 and 16, a second plating layer 62 is formed on selected ones of the lead end surfaces 30c, and a third plating layer 63 is formed on the remaining ones of the lead end surfaces 30c. Specifically, the second plating layer 62 is formed on the lead end surfaces 30c of the first leads 31, the third leads 33 and the fourth leads 34, whereas the third plating layer 63 is formed on the lead end surfaces 30c of the lead frame 30. The second plating layer 62 and the third plating layer 63 are formed by electroless plating. In the electroless plating, the lead frame 30 after the first cutting step is immersed in a plating solution. As a result, metal layers of a type corresponding to the plating solutions are deposited. Thus, the second plating layer 62 and the third plating layer 63 are formed. In the present embodiment, as the second plating layer 62 and the third plating layer 63, a Ni layer, a Pd layer and a Au layer are deposited in the mentioned order. Specifically, a Ni layer is formed to cover the lead end surfaces 30c exposed from the first resin side surface 231. The Pd layer is formed on the Ni layer, and the Au layer is formed on the Pd layer. Note that the second plating layer 62 and the third plating layer 63 are not formed on the first resin side surfaces 231. Also, the second plating layer 62 and the third plating layer 63 are not formed on the protective tape 70 as well.

Figure 17:
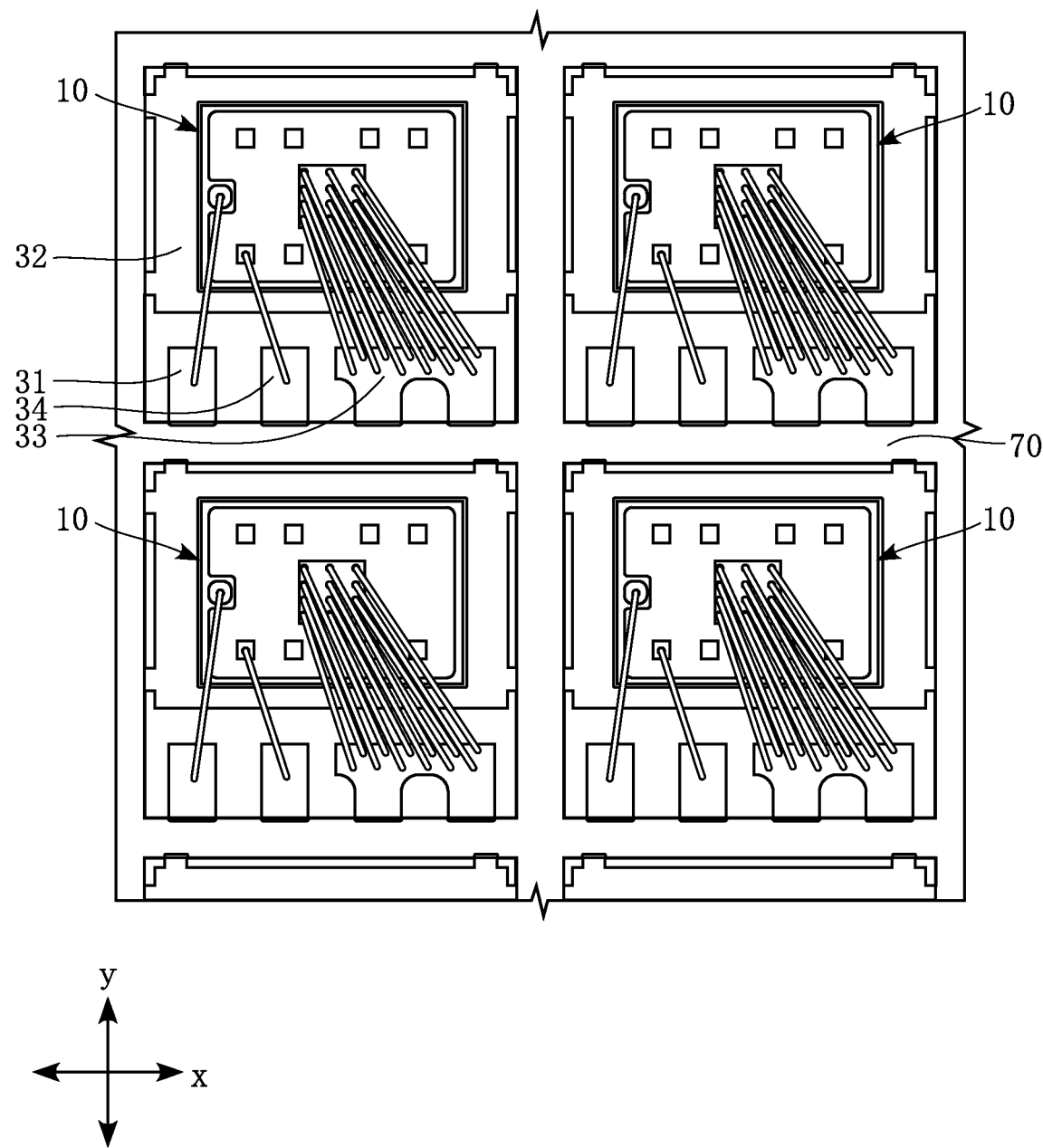
FIG. 17 is a plan view showing a step of the method for manufacturing the semiconductor device of FIG. 1.

Next, as shown in FIG. 17, the sealing resin 20 and the lead frame 30 are cut along the y direction. (Again, at this stage, the protective tape 70 is not cut.) In this cutting step (hereinafter referred to as the second cutting step), the sealing resin 20 and the lead frame 30 are cut along the cutting lines CL shown in FIG. 15. For example, the second cutting step is performed by blade dicing. Instead of blade dicing, plasma dicing or laser dicing may be employed. By this second cutting step, the lead frame 30 is divided in the x direction, whereby the second leads 32 are formed. By the second cutting step, the resin side surfaces 23 (first resin side surfaces 231) are also formed. At this stage, the pieces each including a single semiconductor element 10 and the associated leads 31-34 are still connected to each other by the protective tape 70.

Next, the protective tape 70 is peeled off. Thus, the above-described pieces are separated from each other to become a plurality of semiconductor devices A1, each having a configuration shown in FIGS. 1-7.

The advantages of the semiconductor device A1 and method for manufacturing the semiconductor device A1 are described below.

In the semiconductor device A1, the first lead back surface 31b is exposed from the resin back surface 22, and the first lead end surface 31c is exposed from a resin side surface 23 (one of the first resin side surfaces 231). The first lead back surface 31b is covered with the first plating layer 61, and the first lead end surface 31c is covered with the second plating layer 62. With such a configuration, in mounting the semiconductor device A1 onto a circuit board, solder adheres to the first plating layer 61 and the second plating layer 62. This enhances the mounting strength of the semiconductor device A1 to the circuit board. Since the third lead 33 and the fourth lead 34 have similar configurations, the mounting strength is further enhanced. Also, the second lead back surface 32b of the second lead 32 is exposed from the resin back surface 22 and covered with the first plating layer 61. Thus, in mounting the semiconductor device A1 onto a circuit board, solder also adheres to the first plating layer 61 on the second lead back surface 32b, which also enhances the mounting strength of the semiconductor device A1 to the circuit board.

In the semiconductor device A1, the second plating layer 62 that covers the first lead end surface 31c projects in the y direction relative to the resin side surface 23 (one of the first resin side surfaces 231). Such a configuration provides a higher solder bonding strength than a configuration in which the second plating layer 62 is flush with the resin side surface 23. Thus, the mounting strength of the semiconductor device A1 to the circuit board is enhanced. Since the second plating layer 62 projects in the y direction also for the third and fourth lead end surfaces 33c and 34c, the solder bonding strength is further enhanced.

In the semiconductor device A1, the first lead end surface 31c, the third lead end surfaces 33c and the fourth lead end surface 34c, which are formed by blade dicing, are relatively rough. Such a high surface roughness provides "anchor effect", which allows the second plating layer 62 to strongly adhere to the first lead end surface 31c, the third lead end surfaces 33c and the fourth lead end surface 34c.

In the semiconductor device A1, the first lead back surface 31b covered with the first plating layer 61 and the first lead end surface 31c covered with the second plating layer 62 are connected to each other. As described above, in mounting the semiconductor device A1 onto a circuit board, solder adheres to the first plating layer 61 and the second plating layer 62. According to the present embodiment, since the first lead back surface 31b and the first lead end surface 31c are connected to each other, solder continuously spreads over the first plating layer 61 and the second plating layer 62, forming a solder fillet on the second plating layer 62 exposed from the resin side surface 23 (one of the first resin side surfaces 231). This also enhances the mounting strength of the semiconductor device A1 onto a circuit board. For the same reason, solder fillets are formed at the third lead 33 and the fourth lead 34 as well, which further enhances the mounting strength. Moreover, since solder fillets are formed, the state of solder bonding can be visually observed from above and sideways of the semiconductor device A1.

In the semiconductor device A1, the first plating layer 61 and the second plating layer 62 are made of materials having a higher solder wettability than the materials for the leads 31-34. Thus, in mounting the semiconductor device A1 on a circuit board, solder spreads over the entire surfaces of the first plating layer 61 and the second plating layer 62 to readily form solder fillets.

In the semiconductor device A1, the first plating layer 61 is mainly made of Sn. Making a plating layer of Sn is less costly than making a plating layer of Au. Thus, the manufacturing cost for the entire semiconductor device A1 is reduced. Such a cost reduction of the first plating layer 61 is particularly advantageous for a semiconductor device A1 having a large dimension as viewed in plan.

According to the method for manufacturing the semiconductor device A1, the second plating layer 62 is made by electroless plating. After the first cutting step, the first leads 31, the third leads 33 and the fourth leads 34 are separated from the lead frame 30, as shown in FIGS. 13 and 14, so that the conduction path for electroplating cannot be secured. Thus, it is not possible to perform electroplating to form the second plating layer 62 on the lead end surfaces 30c of the first lead 31, the third lead 33 and the fourth lead 34. In the present embodiment, by employing electroless plating, the second plating layer 62 is reliably formed on the lead end surfaces 30c of the first lead 31, the third lead 33 and the fourth lead 34.

According to the method for manufacturing the semiconductor device A1, the protective tape 70 is attached from the lead back surface 30b side of the lead frame 30. Thus, at least the first plating layer 61 is covered with the protective tape 70. In the subsequent electroless plating step, therefore, the second plating layer 62 is not formed on the first plating layer 61. That is, the second plating layer 62 containing Au is not formed on the back surface side of the semiconductor device A1, which leads to the cost reduction of the semiconductor device A1.

FIGS. 18-27 illustrate other embodiments of a semiconductor device and a method for manufacturing a semiconductor device according to the present disclosure. In these figures, the elements that are identical or similar to those of the foregoing embodiment are denoted by the same reference signs as those used for the foregoing embodiment.

Figure 18:
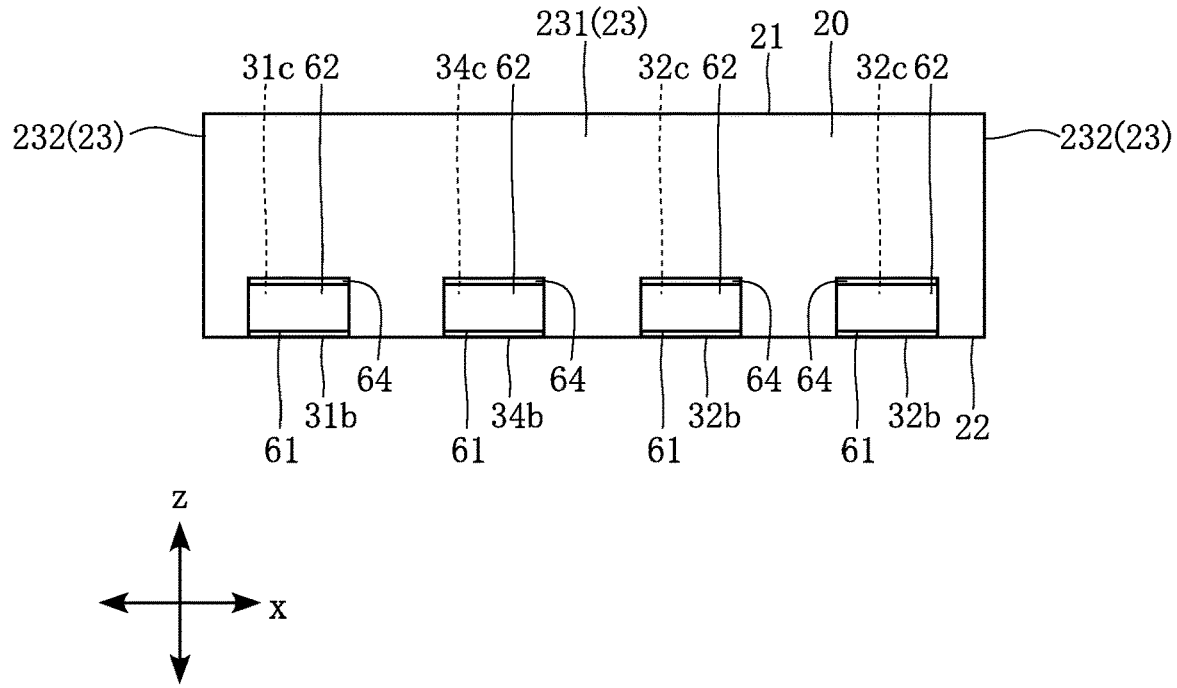
FIG. 18 is a front view showing a semiconductor device according to a second embodiment.
Figure 19:
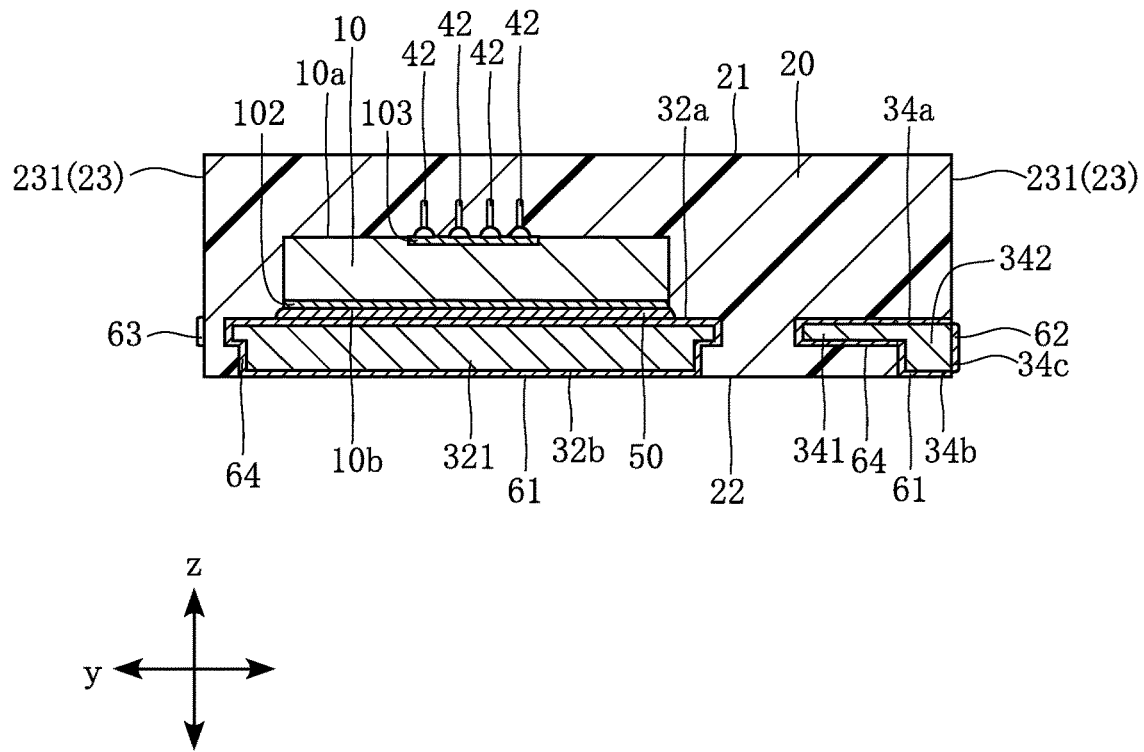
FIG. 19 is a sectional view showing the semiconductor device according to the second embodiment.

FIGS. 18 and 19 show a semiconductor device according to a second embodiment. The semiconductor device A2 of the second embodiment differs from the semiconductor device A1 mainly in material for the first plating layer 61.

FIG. 18 is a front view of the semiconductor device A2. FIG. 19 is a sectional view of the semiconductor device A2, corresponding to FIG. 6 of the first embodiment.

In the present embodiment, the first plating layer 61 is made up of a Ni layer, a Pd layer and a Au layer that are laminated. These layers are formed by electroplating. In the present embodiment, the first plating layer 61 is flush with the resin back surface 22, as shown in FIGS. 18 and 19. Note that the material for the first plating layer 61 is not limited to those described above. For example, the first plating layer 62 may be made of a Au layer alone or a lamination of a Ni layer and a Au layer.

The semiconductor device A2 further includes an inner plating layer 64. The inner plating layer 64 is between the sealing resin 20 and each of the first lead 31, the second lead 32, the third lead 33 and the fourth lead 34. The inner plating layer 64 is made of the same material as that for the first plating layer 61. That is, the inner plating layer 64 is made up of a Ni layer, a Pd layer and a Au layer that are laminated.

Note that when the first plating layer 61 is made of a Au layer alone, the inner plating layer 64 is also made of a Au layer alone. When the first plating layer 61 is a lamination of a Ni layer and a Au layer, the inner plating layer 64 is also a lamination of a Ni layer and a Au layer.

To manufacture the semiconductor device A2, a lead frame 30 having the same shape as that of the first embodiment is prepared and immersed in a plating solution for electroplating. As a result, a plating layer (hereinafter referred to as a surface-plating layer) is formed on the entire surfaces of the lead frame 30 in the state shown in FIG. 8. The surface-plating layer later becomes the first plating layer 61 and the inner plating layer 64. Specifically, the portions of the surface-plating layer that are on the lead back surface 30b of the lead frame 30 are later exposed from the resin back surface 22 of the sealing resin 20 to become the first plating layer 61. On the other hand, the portions of the surface-plating layer other than the portions on the lead back surface 30b are later covered with the sealing resin 20 to become the inner plating layer 64. The lead end surfaces 30c (the first lead end surface 31c, the second lead end surface 32c, the third lead end surfaces 33c and the fourth lead end surface 34c) are formed in a later step by cutting the lead frame 30 and hence are not formed with the surface-plating layer. After the surface-plating layer is formed on the entire surfaces of the lead frame 30, the same steps as those of the first embodiment are performed except the electroplating step of the first embodiment, whereby the semiconductor device A2 shown in FIGS. 18 and 19 is obtained.

This embodiment also enhances the mounting strength of the semiconductor device A2 to a circuit board.

In the semiconductor device A2, the first plating layer 61 is formed by electroplating. Since the materials for the first plating layer 61 are the same as those for the second plating layer 62, it may be considered to form the first plating layer 61 by electroless plating as with the second plating layer in a manner described with respect to the first embodiment. However, electroless plating is generally more costly than electroplating. Thus, forming the first plating layer 61 by electroplating reduces the cost for manufacturing the semiconductor device as compared with forming the first plating layer 61 by electroless plating.

Figure 20:
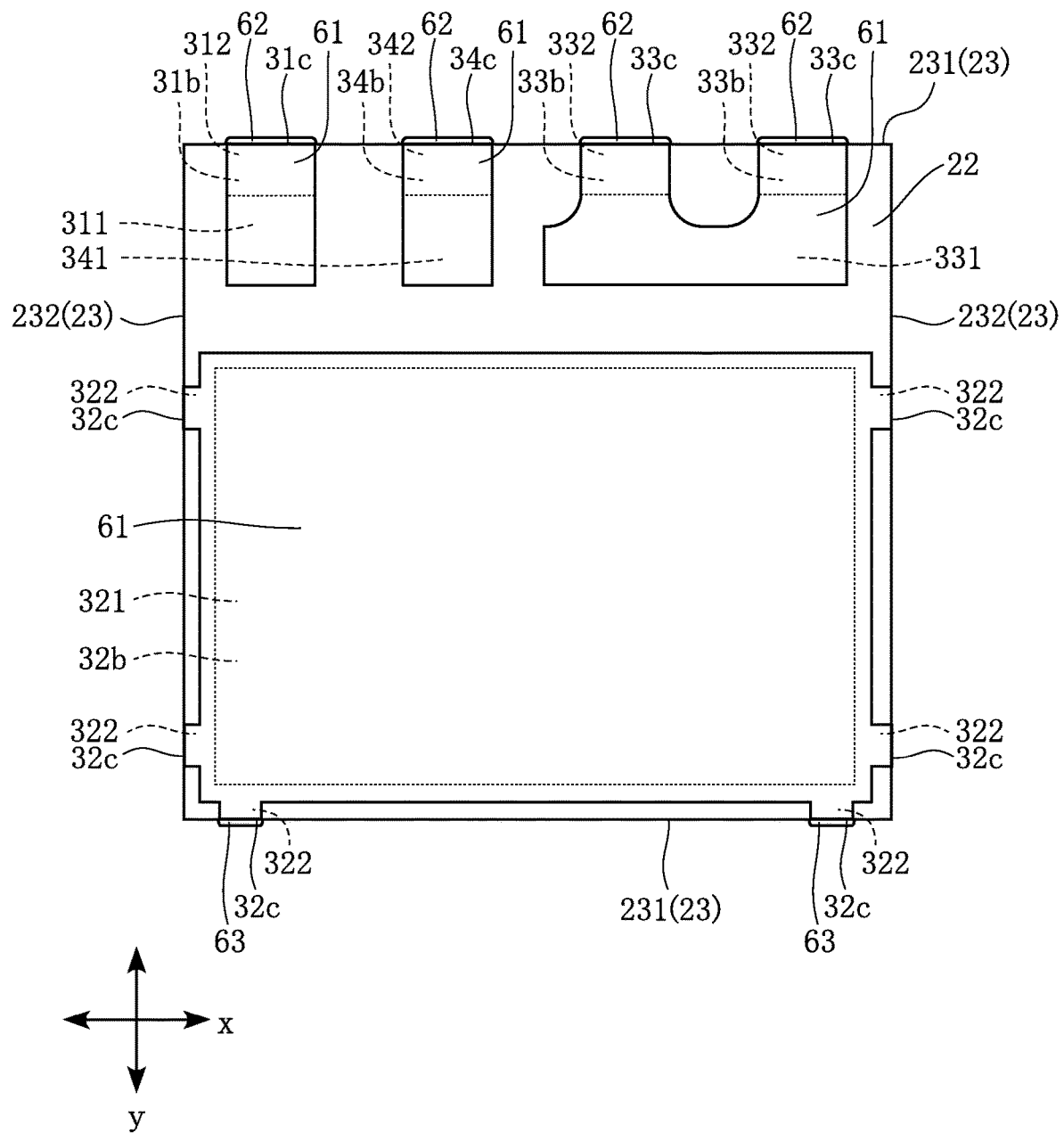
FIG. 20 is a bottom view showing a semiconductor device according to a third embodiment.

FIGS. 20-22 show a semiconductor device according to a third embodiment. The semiconductor device A3 of the third embodiment differs from the semiconductor device A1 mainly in configuration of each lead 31-34.

FIG. 20 is a bottom view of the semiconductor device A3. FIG. 21 is a sectional view of the semiconductor device A3, corresponding to FIG. 6 of the first embodiment. FIG. 22 is a sectional view of the semiconductor device A3, corresponding to FIG. 7 of the first embodiment.

In the first lead 31 of the present embodiment, the thickness of the first bonding pad part 311 is substantially the same as that of the first terminal part 312. The lower surface of the first bonding pad part 311 is not covered with the sealing resin 20 and is exposed from the resin back surface 22. Thus, the lower surface of the first bonding pad part 311 also constitutes the first lead back surface 31b. Thus, the first lead back surface 31b of the present embodiment has a larger area than the first lead back surface 31b of the first embodiment. The third lead 33 and the fourth lead 34 have a similar configuration. Also, in the second lead 32, the thickness of the extensions 322 is the same as that of the second bonding pad part 321. The lower surfaces of the extensions 322 are not covered with the sealing resin 20 and are exposed from the resin back surface 22. Thus, the lower surfaces of the extensions 322 also constitute the second lead back surface 32b. Thus, the second lead back surface 32b of the present embodiment has a larger area than the second lead back surface 32b of the first embodiment.

This embodiment also enhances the mounting strength of the semiconductor device A3 to a circuit board.

As described above, the areas of the lead back surfaces 31b, 32b, 33b, 34b of the leads 31-34 of the semiconductor device A3 are larger than those of the semiconductor device A1. As a result, as shown in FIG. 20, the first plating layer 61 is formed on a larger area as compared with the first embodiment. Thus, in mounting the semiconductor device A3 onto a circuit board, solder adheres to such a larger area, which enhances the mounting strength of the semiconductor device to a circuit board.

Although the first to the third embodiments illustrate the second plating layer 62 made up of a Ni layer, a Pd layer and a Au layer that are laminated, the second plating layer 62 is not limited to such a configuration. For example, the second plating layer 62 may be a metal layer mainly made of Sn, which may be formed by electroless plating using an appropriate plating solution. This variation also enhances the bonding strength of the semiconductor device.

Figure 23:
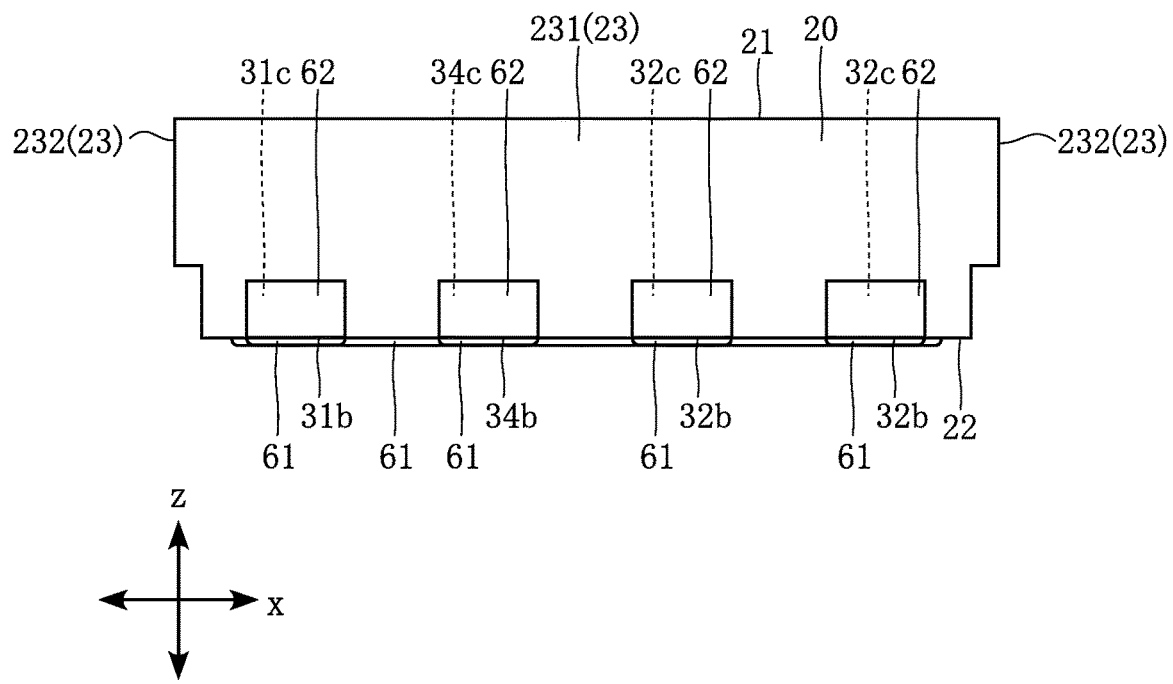
FIG. 23 is a front view showing a semiconductor device according to a variation.
Figure 24:
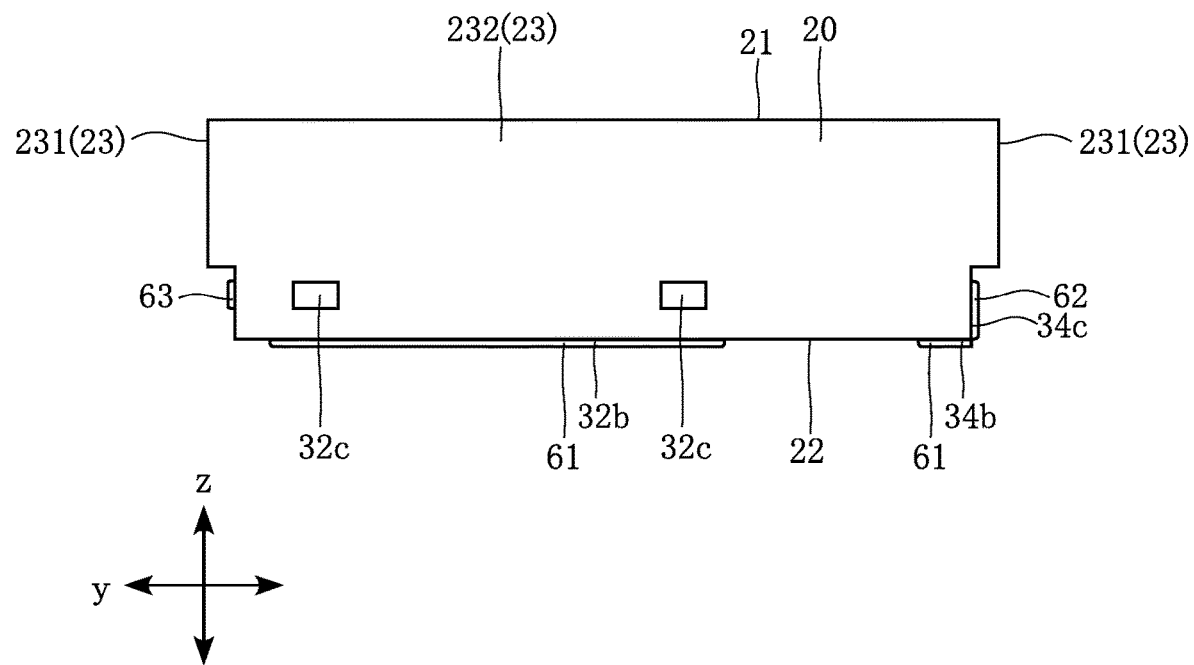
FIG. 24 is a side view showing the semiconductor device according to the variation.
Figure 25:
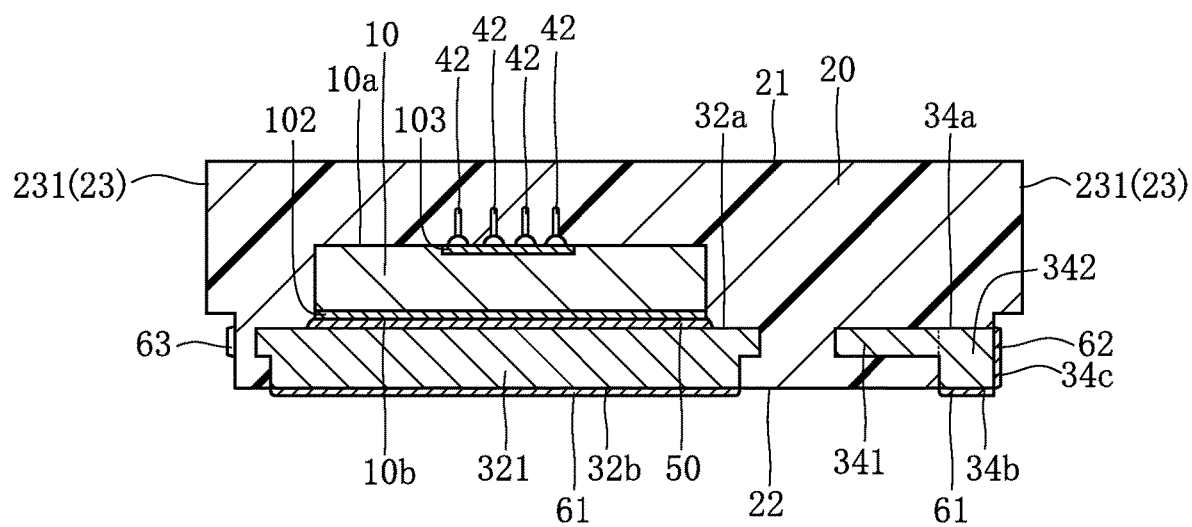
FIG. 25 is a sectional view showing the semiconductor device according to the variation.

Although the first to the third embodiments illustrate the sealing resin 20 having flat resin side surfaces 23, the present disclosure is not limited to this. For example, as shown in FIGS. 23-25, each resin side surface 23 may have a step. FIG. 23 is a front view of the semiconductor device according to such a variation. FIG. 24 is a left side view of the semiconductor device according to the variation. FIG. 25 is a sectional view of the semiconductor device according to the variation, corresponding to FIG. 6 of the first embodiment. In the present variation, each resin side surface 23 is dented inward at its one end (lower end in FIGS. 23-25) in the z direction. This variation also enhances the bonding strength of the semiconductor device. The configuration of the semiconductor device shown in FIGS. 23-25 is merely one example, and the present disclosure is not limited to this.

Figure 26:
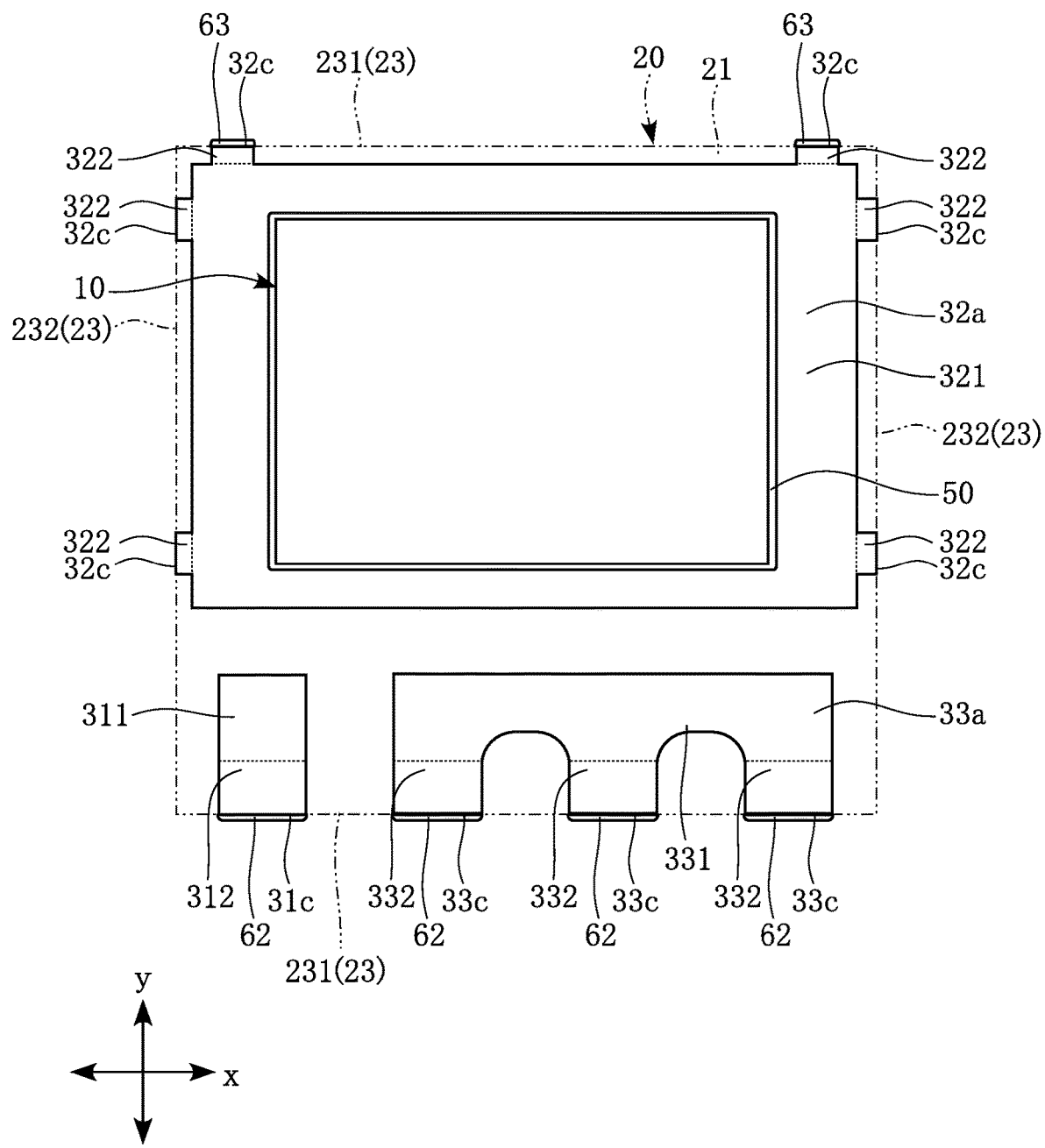
FIG. 26 is a plan view showing a semiconductor device according to another variation.

The number and shape of the leads are not limited to those described in the foregoing embodiments. For example, the number and shape of the leads may be varied in accordance with the number and type of the semiconductor element 10 to be mounted or the number of electrodes of the semiconductor element. FIGS. 26 and 27 are plan views showing semiconductor devices according to such variations. In FIGS. 26 and 27, the sealing resin 20 is illustrated by phantom lines (two-dot chain lines), and illustration of the electrodes 101-104 of the semiconductor element and wires 41-43 is omitted. The variation shown in FIG. 26 does not include the fourth lead 34, unlike the semiconductor device A1. Also, the third lead 33 of this variation include three third terminal parts 332. The variation shown in FIG. 27 includes a second lead 32 and a plurality of leads 35 of the same size and shape. These variations also enhance the bonding strength of the semiconductor device to a circuit board. The semiconductor devices shown in FIGS. 26 and 27 are merely examples, and the present disclosure is not limited to these. For example, when two or more semiconductor elements are mounted, a larger number of leads may be provided.

As described above, in the first to the third embodiments, the edge of the second plating layer 62 on the first side in the z direction (i.e., the lower edge in FIGS. 5 and 6) coincides in position with the edge of the first plating layer 61 on the second side opposite to the first side in the z direction (i.e., the upper edge in FIGS. 5 and 6), as viewed in the y direction. However, the present disclosure is not limited to such a configuration. That is, the positional relationship between these edges may vary depending on the conditions of electroplating (immersion time or types of plating solutions) or the materials for the first plating layer 61 and second plating layer 62. Specifically, the lower edge in the z direction in FIG. 5 of the second plating layer 62 may be positioned between the upper edge and the lower edge of the first plating layer 61 in the z direction or may coincide in position with the lower edge of the first plating layer 61 in the z direction.

In the semiconductor devices A1 to A3 according to the first to the third embodiments, terminals are arranged along one of the resin side surfaces 23 (one of the first resin side surfaces 231). However, the present disclosure is not limited to such a configuration. For example, terminals may be arranged along two resin side surfaces 23 (SON package type) or four resin side surfaces 23 (QFN package type) of the semiconductor device. Even in such a case, the bonding strength of the semiconductor device to a circuit board is enhanced by forming the first plating layer 61 and the second plating layer 62 as described above.

The semiconductor device and method for manufacturing the semiconductor device are not limited to the foregoing embodiments. The specific configuration of each part of the semiconductor device and the specific operation or order of the steps in the manufacturing method may be varied in many ways.

The invention claimed is:

1. A semiconductor device comprising:
   a semiconductor element;
   a plurality of leads electrically connected to the semiconductor element, each of the leads having a lead front surface and a lead back surface opposite to each other in a thickness direction, one of the lead front surfaces supporting the semiconductor element;
   a sealing resin that covers the semiconductor element and a portion of each of the leads; and
   a first plating layer and a second plating layer each exposed from the sealing resin,
   wherein the sealing resin includes a resin side surface facing in a first direction perpendicular to the thickness direction,
   at least one of the leads has a lead end surface connected to the lead back surface and flush with the resin side surface,
   the first plating layer covers the lead back surface,
   the second plating layer covers the lead end surface and projects in the first direction relative to the resin side surface, and
   the second plating layer has an edge in a direction in which the lead back surface faces, said edge overlapping with the first plating layer as viewed in the first direction.

2. The semiconductor device according to claim 1, wherein the lead end surface and the resin side surface are rougher than a surface of the second plating layer.

3. The semiconductor device according to claim 1, wherein the second plating layer is made of a material having a higher solder wettability than a material for the leads.

4. The semiconductor device according to claim 1, wherein the first plating layer is made of a material different from the material for the second plating layer.

5. The semiconductor device according to claim 1, wherein the semiconductor element includes an element front surface and an element back surface, the element front surface facing in a direction in which the lead front surface faces and formed with a first electrode, the element back surface facing in a direction in which the lead back surface faces and formed with a second electrode.

6. The semiconductor device according to claim 3, wherein the material for the leads comprises Cu.

7. The semiconductor device according to claim 6, wherein the second plating layer comprises a Au layer.

8. The semiconductor device according to claim 7, wherein the second plating layer further comprises a Ni layer and a Pd layer, and the Ni layer, the Pd layer and the Au layer are laminated.

9. The semiconductor device according to claim 4, wherein the material for the first plating layer comprises Sn.

10. The semiconductor device according to claim 9, wherein the sealing resin includes a resin back surface that faces in a direction in which the lead back surface faces and is flush with the lead back surface, and the first plating layer projects relative to the resin back surface in the thickness direction.

11. The semiconductor device according to claim 5, further comprising a first wire and an electrically conductive bonding material, wherein the plurality of leads include a first lead and a second lead that are spaced apart from each other, the first lead is electrically connected to the first electrode with the first wire, and the second lead is electrically connected to the second electrode via the electrically conductive bonding material.

12. The semiconductor device according to claim 11, further comprising a third wire, wherein the element front surface is further formed with a third electrode that is different from the first electrode, the plurality of leads further include a third lead spaced apart from the first lead and the second lead, and the third lead is electrically connected to the third electrode with the second wire.

13. The semiconductor device according to claim 12, wherein the semiconductor element comprises a MOSFET.

14. A method for manufacturing a semiconductor device, the method comprising:
   mounting a semiconductor element on a front surface of a lead frame that includes a back surface opposite to the front surface in a thickness direction;
   forming a sealing resin to cover the semiconductor element and a portion of the lead frame such that the back surface of the lead frame is exposed from the sealing resin;

forming a first plating layer by electroplating to cover the back surface of the lead frame;

attaching a protective tape to cover the back surface of the lead frame and the first plating layer;

cutting the lead frame and the sealing resin, with the protective tape attached, such that a resin side surface is formed on the sealing resin and a lead end surface is formed on the lead frame, the resin side surface facing in a first direction perpendicular to the thickness direction, the lead end surface being exposed from the resin side surface and flush with the resin side surface; and forming a second plating layer, with the protective tape attached, by electroless plating to cover the lead end surface.

15. The method according to claim 14, wherein a material for forming the second plating layer has a higher solder wettability than a material for forming the lead frame.

16. The method according to claim 14, wherein the electroplating is performed after the sealing resin is formed.

17. The method according to claim 15, wherein the material for the lead frame comprises Cu, and the second plating layer comprises at least a Au layer.

18. The method according to claim 16, wherein the material for the first plating layer comprises Sn.

* * * * *